United States Patent
Uchiyama et al.

(10) Patent No.: US 9,293,597 B2
(45) Date of Patent: Mar. 22, 2016

(54) OXIDE SEMICONDUCTOR DEVICE

(75) Inventors: Hiroyuki Uchiyama, Musashimurayama (JP); Hironori Wakana, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 172 days.

(21) Appl. No.: 13/811,227

(22) PCT Filed: Jul. 1, 2011

(86) PCT No.: PCT/JP2011/065201
§ 371 (c)(1),
(2), (4) Date: Apr. 4, 2013

(87) PCT Pub. No.: WO2012/014628
PCT Pub. Date: Feb. 2, 2012

(65) Prior Publication Data
US 2013/0187154 A1    Jul. 25, 2013

(30) Foreign Application Priority Data
Jul. 30, 2010    (JP) .................. 2010-171818

(51) Int. Cl.
| H01L 29/86 | (2006.01) |
| H01L 29/786 | (2006.01) |
| H01L 21/02 | (2006.01) |
| H01L 27/12 | (2006.01) |
| H01L 27/32 | (2006.01) |

(52) U.S. Cl.
CPC ...... *H01L 29/7869* (2013.01); *H01L 29/78693* (2013.01); *H01L 29/78696* (2013.01); *H01L 21/02554* (2013.01); *H01L 21/02565* (2013.01); *H01L 21/02573* (2013.01); *H01L 21/02631* (2013.01); *H01L 27/1225* (2013.01); *H01L 27/3248* (2013.01); *H01L 27/3262* (2013.01)

(58) Field of Classification Search
None
See application file for complete search history.

(56) References Cited

U.S. PATENT DOCUMENTS 6,852,623 B2    2/2005 Park et al.
6,903,372 B1 *    6/2005 Yamaguchi et al. .......... 257/66
(Continued)

FOREIGN PATENT DOCUMENTS

| CN | 101060084 A | * 10/2007 |
| JP | 2006-165532 A | 6/2006 |

(Continued)

OTHER PUBLICATIONS

Chen, L.L. et al., Control and improvement of p-type conductivity in indium and nitrogen codoped ZnO thin films, Dec. 21, 2006, Applied Physics Letters 89, 252113.*

(Continued)

*Primary Examiner* — Zandra Smith
*Assistant Examiner* — Molly Reida
(74) *Attorney, Agent, or Firm* — Miles & Stockbridge P.C.

(57) ABSTRACT

Disclosed is a technique for suppressing fluctuation of device characteristics in thin film transistors using an oxide semiconductor film as a channel layer. In a thin film transistor using an oxide semiconductor film as a channel layer (4), said channel layer (4) is configured from an oxide semiconductor having as main materials a zinc oxide and tin oxide with introduced group IV elements or group V elements, wherein the ratio (A/B) of the impurity concentration (A) of the group IV elements or group V elements contained in the channel layer (4) and the impurity concentration (B) of the group III elements contained in the channel layer (4) satisfies $A/B \leq 1.0$, and ideally $A/B \leq 0.3$.

21 Claims, 14 Drawing Sheets

(56) References Cited

U.S. PATENT DOCUMENTS

| | | | |
|---|---|---|---|
| 7,906,777 B2 | 3/2011 | Yano et al. | |
| 2005/0199880 A1* | 9/2005 | Hoffman et al. | 257/72 |
| 2006/0113539 A1 | 6/2006 | Sano et al. | |
| 2006/0113565 A1 | 6/2006 | Abe et al. | |
| 2007/0194379 A1* | 8/2007 | Hosono et al. | 257/347 |
| 2007/0215456 A1 | 9/2007 | Abe et al. | |
| 2010/0330738 A1 | 12/2010 | Uchiyama et al. | |
| 2011/0001136 A1* | 1/2011 | Hasegawa et al. | 257/43 |
| 2011/0260121 A1 | 10/2011 | Yano et al. | |
| 2013/0092931 A1* | 4/2013 | Knutson et al. | 257/43 |

FOREIGN PATENT DOCUMENTS

| | | |
|---|---|---|
| JP | 2006-173580 A | 6/2006 |
| JP | 207-142196 A | 6/2007 |
| KR | 10-2004-0079516 | 9/2004 |
| WO | WO 2010/067571 A1 | 6/2010 |

OTHER PUBLICATIONS

McCluskey, M.D. et al., Sources of n-type conductivity in ZnO, 2007, Physica B, 401-402, 355-357.*

Janotti, A. et al., Fundamentals of zinc oxide as a semiconductor, Oct. 22, 2009, Rep. on Prog. in Phys., 72, 126501.*

Janotti, A. et al., Controlling the conductivity in oxide semiconductors, 2002, Springer Series in Materials Science, Functional Metal Oxide Nanostructures, 149.*

Office Action issued Mar. 19, 2013, in Korean Patent Application No. 10-2011-21313.

Office Action issued May 8, 2014 in U.S. Appl. No. 13/049,869.

U.S. Appl. No. 13/049,869, filed Mar. 16, 2011.

* cited by examiner (a)

(b)

OXIDE SEMICONDUCTOR DEVICE

TECHNICAL FIELD

The present invention concerns an oxide semiconductor device and, particularly, relates to a technique which is effective when applied to an oxide semiconductor device (oxide semiconductor thin film transistor) used for electronic devices such as flat panel displays (FPD), organic electroluminescence (EL) illumination, photo voltaic devices, radio frequency identification (RFID), etc.

BACKGROUND ART

In recent years, display devices have been progressed from display devices using cathode ray tubes to flat panel display devices referred to as FPD such as liquid crystal displays or plasma displays. In FPD, thin film transistors have been adopted as switching elements concerned with display switching by liquid crystals. For example, as the switching element for the liquid crystal displays, thin film transistors in which amorphous silicon or crystal silicon is applied to a channel layer have been adopted. For the FPD, provision of new functions such as large area, high-definition, flexible configuration, etc. have been demanded and the adaptability has been demanded also for a process that enables manufacture of FPD of a large area or flexible substrate as well as high performance as an image element device.

Further, organic EL displays utilizing organic EL has also been developed recently with an aim for attaining larger area or flexible structure. Also in the organic EL display devices, thin film transistors have been adopted as the switching element. However, since the organic EL display is a self-emitting device in which an organic semiconductor layer is driven to emit light, characteristics as a current driving device have been demanded for the thin film transistor unlike the case in the liquid crystal displays.

With the background as described above, for improving the transistor characteristics of thin film transistors intended for display devices, application of an oxide semiconductor having a band gap as large as about 3 eV, being transparent, and capable of being formed at a low temperature to a channel layer of a thin film transistor has been investigated. For the oxide semiconductor, it has been expected for the application use to thin film memories, RFIDs, etc. in addition to the display devices.

As the oxide semiconductor forming a channel layer of the thin film transistor, zinc oxide (ZnO) and tin oxide ($SnO_x$) have been used generally but the thin film transistors using them involve a problem that a threshold voltage tends to fluctuate. Then, as an oxide semiconductor capable of suppressing the fluctuation of the threshold voltage of the thin film transistor, an indium gallium zinc complex oxide (IGZO) has been proposed.

For example, Japanese Unexamined Patent Application Publication No. 2006-165532 (Patent Literature 1) discloses a semiconductor device having a P-type region and an N-type region and using an amorphous oxide at an electron carrier concentration of less than $10^{18}/cm^3$ for the N-type region in which the amorphous oxide is an oxide including indium (In), gallium (Ga), and zinc (Zn).

Further, Japanese Unexamined Patent Application Publication No. 2006-173580 (Patent Literature 2) describes a field effect transistor having an active layer including an amorphous oxide at an electron carrier concentration of less than $10^{18}/cm^3$, or an amorphous oxide that tends to increase the electron mobility along with increase in the electron carrier concentration, in which at least one of a source electrode, a drain electrode, and a gate electrode has permeability to light in a visible region and the amorphous oxide is an oxide containing In, Zn, and Ga.

In a thin film transistor in which IGZO is applied to a channel layer, a more preferred value of sub-threshold slope than that of a thin film transistor in which poly silicon is applied to a channel layer has been confirmed. Further, IGZO is expected to have application use not only to display devices but also to other devices requiring ultra low voltage operation or ultra low power consumption. On the other hand, however, since IGZO contains a considerable amount of In or Ga involving the possibility of depletion of resources or maldistribution of resources, it is considered that IGZO is not advantageous in the future industrial use.

Then, the inventors of the present application have investigated a zinc tin complex oxide (ZTO) as an oxide semiconductor not utilizing In. As a result, in a thin film transistor in which IGZO is applied to the channel layer, transistor characteristics comparable with those of thin film transistor in which IGZO is applied to a channel layer could be obtained. Further, it is estimated that there may be a great demand also for oxide semiconductor targets used upon deposition of oxide semiconductors by a sputtering method or a physical vapor deposition method in the feature and it is considered that a material such as ZTO not using a rare earth metal is superior to the material using the rare earth metal such as In or Ga also in view of the cost or sustainability of resources.

CITATION LIST

Patent Literature

Patent Literature 1: Japanese Unexamined Patent Application Publication No. 2006-165532
Patent Literature 2: Japanese Unexamined Patent Application Publication No. 2006-173580

SUMMARY OF THE INVENTION

Technical Problem

In a thin film transistor in which an oxide semiconductor such as ZTO is applied to a channel layer, a film thereof including the oxide semiconductor (hereinafter referred to as an oxide semiconductor film) is generally formed by a sputtering method or a physical vapor deposition method. However, in the process of manufacturing a target used in the sputtering method or the physical vapor deposition method, a group III element that has a concern in the generation of carriers such as aluminum (Al) often contaminates a target.

For example, when a ZTO film is deposited, fine particles of zinc oxide and tin oxide at high purity (for example, 99.99% or higher) are used for the powder material as the starting target material. In the step of refining and mixing to slurry the powder materials, the powder materials are mixed sufficiently by using pulverizing balls in a ball mill in order to obtain a sintered product with no composition distribution. However, since the material used as the pulverizing balls charged in the ball mill include alumina ($Al_2O_3$), Al as a doner is contaminated as an impurity by about 0.1 to 3.0 wt % (0.3 to 9.0 at. %) into the sintered product.

If such group III element contaminated the oxide semiconductor film forming the channel layer of the thin film transistor, the oxide semiconductor film does not operate as a semiconductor to result in a problem that the thin film transistor cannot perform off operation. It is considered that this is attributable to that the starting target material, being an oxide material, has high affinity and the group III element easily contaminated the form of an oxide (for example, $Al_2O_3$) into the oxide semiconductor film to fluctuate device characteristics such as a threshold voltage of the thin film transistor.

An object of the present invention is to provide a technique capable of suppressing the fluctuation of device characteristics in a thin film transistor in which an oxide semiconductor film is applied to a channel layer.

The foregoing and other objects and novel features of the present invention will become apparent in view of the descriptions of the present specification and the appended drawings.

Solution to Problem

Among the inventions described in the present application, an embodiment of typical inventions is to be described briefly as below.

This embodiments provides a thin film transistor having an oxide semiconductor film applied to a channel layer, in which the channel layer is formed of an oxide semiconductor including zinc oxide and tin oxide with addition of a group IV element or a group V element as main materials, and a ratio between an impurity concentration (A) of a group IV element or a group V element contained in the channel layer and an impurity concentration (B) of a group III element contained in the channel layer is defined as: $A/B \leq 1.0$, preferably, $A/B \leq 0.3$.

Advantageous Effects of Invention

Effects obtained by an embodiment of typical inventions disclosed in the present application are to be described briefly as below.

In the thin film transistor in which an oxide semiconductor film is applied to the channel layer, fluctuation of device characteristics can be suppressed.

DESCRIPTION OF EMBODIMENTS

Figure 1:
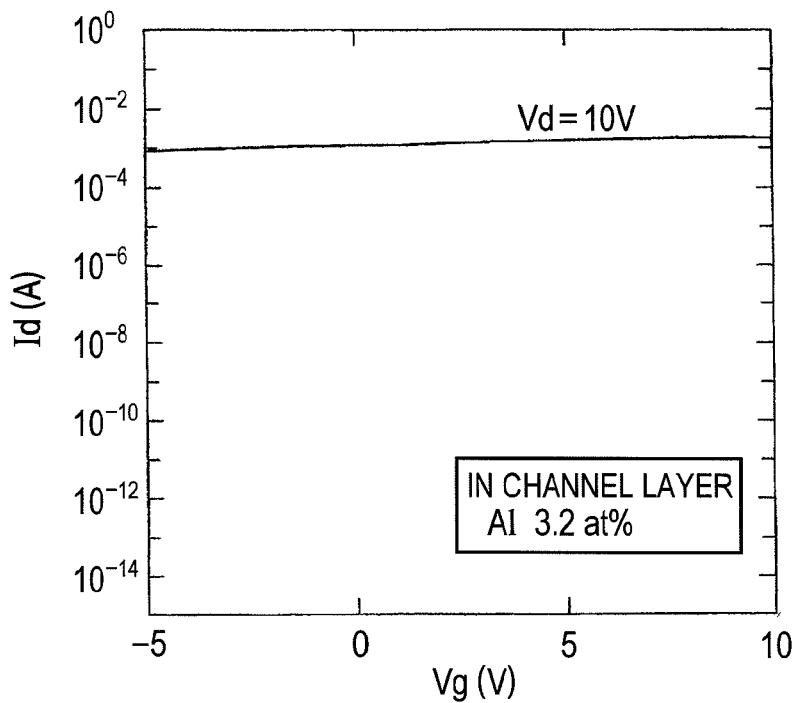
FIG. 1 is a graph showing transfer characteristics of a thin film transistor investigated by the inventors of the present application in which a ZTO film formed by using a ZTO target at a purity of 2N level is applied to a channel layer.

In the following embodiments, description is to be made while dividing into a plurality of sections or embodiments when this is necessary for the sake of convenience. However, they are not unrelated to each other but are in such a relation that one is modification, details, supplementary explanation, etc. of a part or entirety of others unless otherwise specified.

Further, in the following embodiments, when numbers of constituents, etc. (including numbers, numerical values, quantity, range, etc.) are referred to, they are not restricted to the specified number but may be more than or less than the specified number unless otherwise specified or they are apparently restricted to the specified numbers in principle. Further, in the following embodiments, it is needless to say that the constituent elements (also including constituent steps, etc.) are not always essential unless otherwise specified or apparently considered as essential in principle. In the same manner, when the shape, positional relation, etc. of the constituents, etc. are referred to in the following embodiments, they include those which are substantially approximate to or similar with the shape, etc. thereof unless otherwise specified and considered apparently not so in principle. This is applicable also to the numerical values and the ranges described above.

Further, in the drawings used for the following embodiments, even plan views may be sometimes hatched in order to make the drawings easy to see. Further, throughout the drawings for explaining the following embodiments, those having identical functions carry the same references as a rule, for which duplicate descriptions are to be omitted. The embodiments of the invention are to be described specifically with reference to the drawings.

First Embodiment

In the present invention, as an impurity element that counters group III elements (boron (B), Al, Ga, In) which are impurity elements generating carriers (electrons due to oxygen depletion in the case of oxide) as a donor (counter doping element or counter doping material), a group IV element or a group V element serving to offset the carrier is added to an oxide semiconductor to control the number of carriers in an oxide semiconductor.

FIG. 1 is a graph showing drain current (Id)-gate voltage (Vg) characteristics of a thin film transistor when Al (group III element) is intentionally added to a starting material in the manufacturing step of a ZTO target to lower the purity of the ZTO target to the 2N level and a ZTO film formed by using the ZTO target is applied to a channel layer.

A normal thin film transistor is expected to show transfer characteristics that current increases abruptly from a threshold voltage near 0 V, and the current is saturated along with increase of the voltage. However, it can be seen that, in a thin film transistor of in which a ZTO film formed by using a ZTO target at a purity of the 2N level is applied to a channel layer, an off state cannot be obtained in a negative bias region and the switching operation is impossible. The impurity concentration of Al in the ZTO target in this case is 0.3 wt. % (1.1 at. %) and it is considered that the off state cannot be obtained in the negative bias region because of increase of carriers in the ZTO film due to Al contamination.

Then, carriers (electrons) generated by the addition of the group III element are offset by the addition of a group IV element or a group V element having larger electro-negativity than the group III element to offset carriers generated by the addition of the group III element and suppress the number of the carriers.

Figure 2:
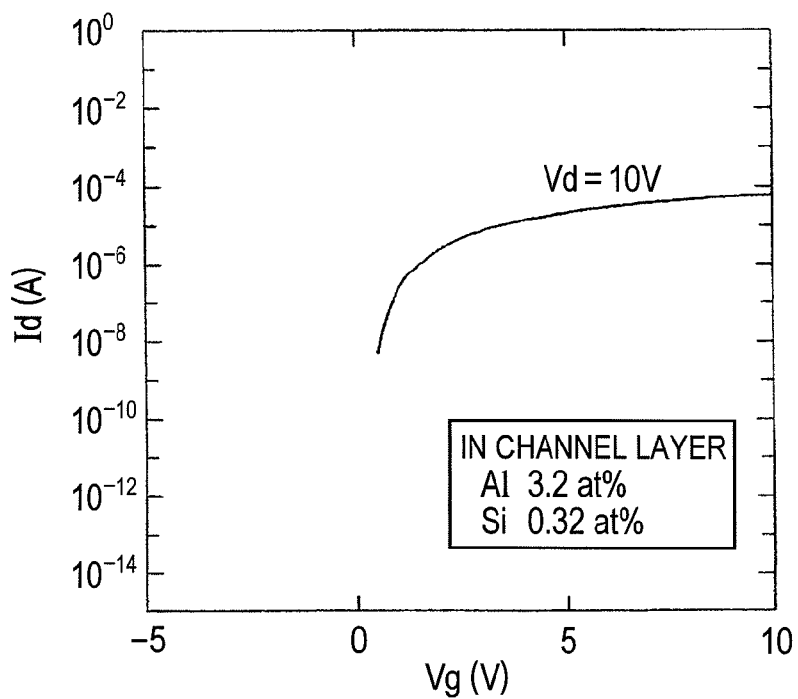
FIG. 2 is a graph showing transfer characteristics of a thin film transistor according to a first embodiment of the invention in which a ZTO film formed by using a ZTO target (fine $SiO_2$ particles at a high purity are added as a counter doping material upon forming a sintered product) is applied to a channel layer.

FIG. 2 is a graph showing drain current (Id)-gate voltage (Vg) characteristics of a thin film transistor when a ZTO target is manufactured by intentionally adding Al (group III element) and fine particles of silicon oxide ($SiO_2$) at a high purity (99.99% or higher) to a starting material in the process for manufacturing a ZTO target and in which a ZTO film formed by using the ZTO target is applied to a channel layer. In this process, fine $SiO_2$ particles are added to the starting material such that the impurity concentration of the fine $SiO_2$ particles is about 1/15 of the impurity concentration of Al in the ZTO target (about 0.3 wt. % (1.1 at. %)) of the starting material).

It can be seen that the carriers in the ZTO film are suppressed by the addition of silicon (Si) (group IV element) to obtain good transfer characteristics. As described above, for suppressing the excessive carriers caused by the group III element contamination during the process for manufacturing the ZTO target, it is effective to add a group IV element or a group V element at an appropriate impurity concentration corresponding to the impurity concentration of the group III element. The impurity concentration of the group IV element or the group V element which is effective as the counter doping element is ½ or less, preferably, 1/10 or less of the impurity concentration of the group III element. That is, the ratio between the impurity concentration ($a$) of the group IV element or the group V element in the ZTO target which is effective as the counter doping element and the impurity concentration of the group III element is a/b 0.5, preferably, a/b≤0.1.

When the ZTO film is formed by a sputtering method or a vapor deposition method using a target, the material composition of the ZTO film after film deposition is different from the material composition of the target per se depending on the flying state of target particles. For example, the impurity concentration of Al in the ZTO film was 3.2 at. % in the example of FIG. 1 and FIG. 2 described above. Accordingly, the material composition of the channel layer including the ZTO film which is utilized to the thin film transistor is different from the material composition of the target. From a result of compositional analysis, etc., the ratio of the impurity concentration (A) of the group IV element or the group V element contained in the channel layer which is effective as the counter doping element and the impurity concentration (B) of the group (III) element contained in the channel layer can be defined as: A/B≤1.0, preferably, A/B≤0.3.

If the counter doping element is added at higher concentration than that described above, since the carrier supplementary sites are increased, this deteriorates a sub-threshold slope value or increases the shift of the threshold voltage due to bias stress, which is not effective as transistor characteristics.

Then, an oxide semiconductor target used in the sputtering method according to the first embodiment is to be described.

A ZTO target including a zinc oxide powder and a tin oxide powder at high purity (for example, 99.99% or higher) is prepared. For example, a zinc oxide powder and a tin oxide powder are mixed in such a molar amount to provide a Zn/(Zn+Sn) compositional ratio of 0.7 in the deposited ZTO film. Since alumina balls are used for mixing the starting material powders, Al (group III element) intrudes into the starting materials. The impurity concentration is estimated as about 1.0 at. %. However, fine $SiO_2$ particles at high concentration (99.99% or higher) are added such that the impurity concentration of Si (group IV element) is about ⅓ based on the impurity concentration of Al. The resistivity of the ZTO target obtained by measurement according to a four-point probe method is about 1.0 Ωcm or more although this fluctuates somewhat depending on the oxygen composition in the sintered product.

Since discharge according to a DC bias is difficult for a ZTO target, a ZTO film is formed by a sputtering method according to RF bias. For example, a ZTO film is formed by using an argon (Ar) gas with addition of an oxygen gas at about 15% as a sputtering gas and under the conditions at a pressure of 0.5 Pa, and a RF power density of 2.65 W/cm², and for inter-electrode distance of 80 mm. The resistivity of the ZTO film formed under the conditions described above is about 2.0 am. While the resistivity of the ZTO film can be controlled depending on the partial pressure of the oxygen gas to be added, it is preferably 0.1 Ωcm or more when the ZTO film is applied as a semiconductor film.

Figure 3:
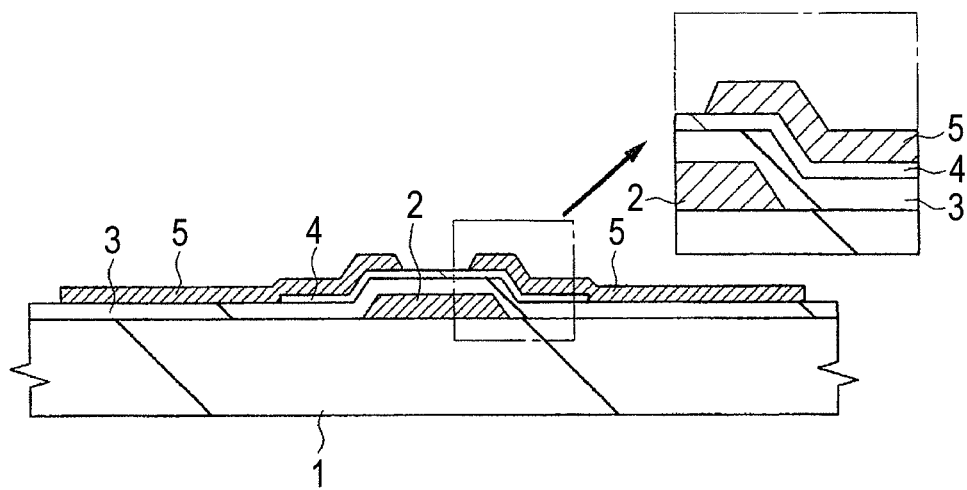
FIG. 3 is a cross sectional view of a main portion of a thin film transistor according to the first embodiment of the invention in which a ZTO film formed by using a ZTO target is applied to a channel layer.

Then, the structure of a thin film transistor according to the first embodiment is to be described with reference to a cross sectional view of a main portion shown in FIG. 3. In FIG. 3, numeral 1 denotes a support substrate, numeral 2 denotes a gate electrode, numeral 3 denotes a gate insulating film, numeral 4 denotes a channel layer, and numeral 5 denotes a source-drain electrode.

For example, the gate electrode 2 is formed over the main surface of the support substrate 1, for example, a glass substrate, quartz substrate, sapphire substrate, or resin substrate, or a film. The gate electrode 2 includes, for example, a metal film such as a molybdenum (Mo) film or Al film, a stacked metal film including an Al film, Mo film, etc., or a transparent electroconductive film, for example, an indium tin oxide (ITO) film, indium zinc oxide (IZO) film, aluminum doped zinc oxide (AZO) film, or gallium doped zinc oxide (GZO) film. When the gate electrode 2 is formed of the metal film or the stacked metal film, the thickness is, for example, about 300 nm.

The gate insulating film 3 is formed in the layer over the gate electrode 2. The gate insulating film 3 includes, for example, an oxide film (for example, silicon oxide film) or a nitride film (for example, silicon nitride film) and the thickness thereof is, for example, about 100 nm.

The channel layer 4 is formed in a layer over the gate insulating film 3. The channel layer 4 includes a ZTO film formed by a sputtering method using the ZTO target described above and the thickness thereof is, for example, about 5 nm to 75 nm.

In the layer over the channel layer 4, two source-drain electrodes 5 (electrodes that function as the source electrode or the drain electrode) are formed with a predetermined distance (channel length) therebetween. The source-drain electrode 5 includes, for example, a metal film such as an Mo film or Al film, a stacked metal film including an Al film and Mo film, or a transparent electroconductive film such as an ITO film, IZO film, AZO film, or GZO film.

Figure 4:
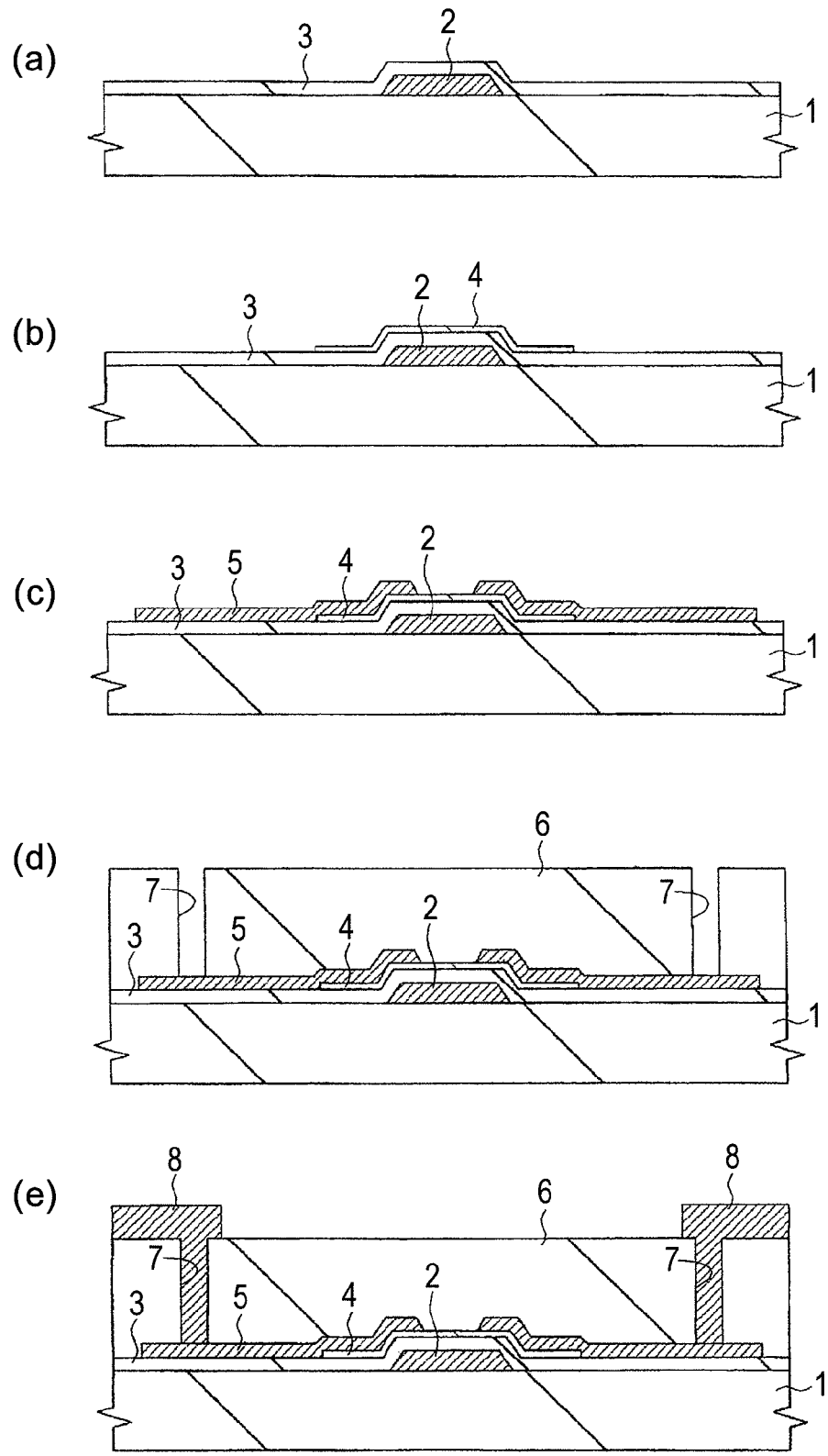
FIG. 4 (a) to (e) are cross sectional views of a main portion of a thin film transistor for explaining the process for manufacturing a thin film transistor according to the first embodiment of the invention, in which a ZTO film formed by using a ZTO target is applied to a channel layer.

Then, a method of manufacturing the thin film transistor according to the first embodiment is to be described with reference to FIG. 4(a) to (e) successively. FIG. 4(a) to (e) are cross sectional views of a main portion showing the structure of a thin film transistor in which a ZTO film formed by using a ZTO target is applied to the channel layer respectively. In FIG. 4, numeral 1 denotes a support substrate, numeral 2 denotes a gate electrode, numeral 3 denotes a gate insulating film, numeral 4 denotes a channel layer, numeral 5 denotes a source-drain electrode, numeral 6 denotes a passivation film, numeral 7 denotes a connection hole, and numeral 8 denotes an interconnect.

At first, as shown in FIG. 4(a), a substrate 1, for example, a glass substrate, quartz substrate, sapphire substrate, resin substrate or a film is prepared. Then, an electroconductive film is deposited over the main surface of the support substrate 1 by a vapor deposition method, sputtering method or the like. The electroconductive film is a metal film, for example, an Mo film or Al film, a, stacked metal film including an Al film, Mo film, etc. or a transparent electroconductive film; for example, an ITO film, IZO film, AZO film, and GZO film. Successively, the electroconductive film is fabricated by a lift-off process or an etching process to form the gate electrode 2.

Then, an insulating film (for example an oxide film (for example, silicon oxide film) or a nitride film (for example, a silicon nitride film), etc.), for example, of about 100 nm thickness is deposited to a layer over the gate electrode 2 by a sputtering method, a chemical vapor deposition (CVD) method, or a vapor deposition method to form a gate insulating film 3 including the insulating film.

Then, as shown in FIG. 4(b), a ZTO film is deposited to a layer over the gate insulating film 3 by an RF magnetron sputtering method using the ZTO target. Successively, the ZTO film is fabricated by a wet etching method using an oxalic acid-based etching solution or a hydrochloric acid-based etching solution by using a resist pattern as a mask to form the channel layer 4. The thickness of the channel layer 4 (ZTO film) is preferably about 5 nm to 75 nm although it is different depending on the device to be applied.

Then, as shown in FIG. 4(c), an electroconductive film is deposited in a layer over the channel layer 4 including the ZTO film by a vapor deposition method or sputtering method, etc. The electroconductive film is, for example, a metal film such as an Mo film or an Al film, a stacked metal film including, for example, an Al film and an Mo film, or a transparent electroconductive film such as an ITO film, IZO film, AZO film, or GZO film. Successively, the electroconductive film is fabricated by a lift-off process or an etching process to form the source-drain electrode 5.

Then, as shown in FIG. 4(d), a passivation film 6 covering the channel layer 4 and the source-drain electrode 5 is deposited. Successively, the passivation film 6 is fabricated using a resist pattern as a mask to form a connection hole 7 as far as the source-drain electrode 5.

Then, as shown in FIG. 4(e), an electroconductive film is deposited to the layer over the passivation film 6 including the inside of the connection hole 7. The electroconductive film is, for example, a metal film such as an Al film, a stacked metal film including, for example, a titanium (Ti) film, gold (Au) film, etc. or a transparent electroconductive film such as an ITO film, IZO film, AZO film, or GZO film. Successively, the electroconductive film is fabricated using a resist pattern as a mask to form an interconnect 8: By way of the manufacturing process described above, a bottom gate top contact thin film transistor according to the first embodiment is completed substantially.

Characteristics of the thin film transistor formed by the manufacturing method described above with reference to FIG. 4(a) to (e) were evaluated. A ZTO film of 25 nm in thickness formed by an RF magnetron sputtering method using a ZTO target was applied to the channel layer of the thin film transistor. A substrate rotating mechanism at 5 rpm is used upon deposition of the ZTO film. The gate electrode includes an Mo film (300 nm thickness) and the source-drain electrode includes a stacked metal film of an Al film (150 nm thickness) and a Co film (10 nm thickness). Further, the gate length is 3 μm and the gate width is 50 μm. In the thin film transistor, fluctuation of a threshold voltage is suppressed to 0.5 V or less in continuous use over 1000 hours and preferred values were obtained also for other basic characteristics, for example, a mobility of 20 cm²/Vs or more and an on-off ratio of $10^6$ or more. In the ZTO film after deposition, the Al impurity concentration is 3.2 at. % and the Si impurity concentration as the counter doping element is 1.1 at. %.

Figure 5:
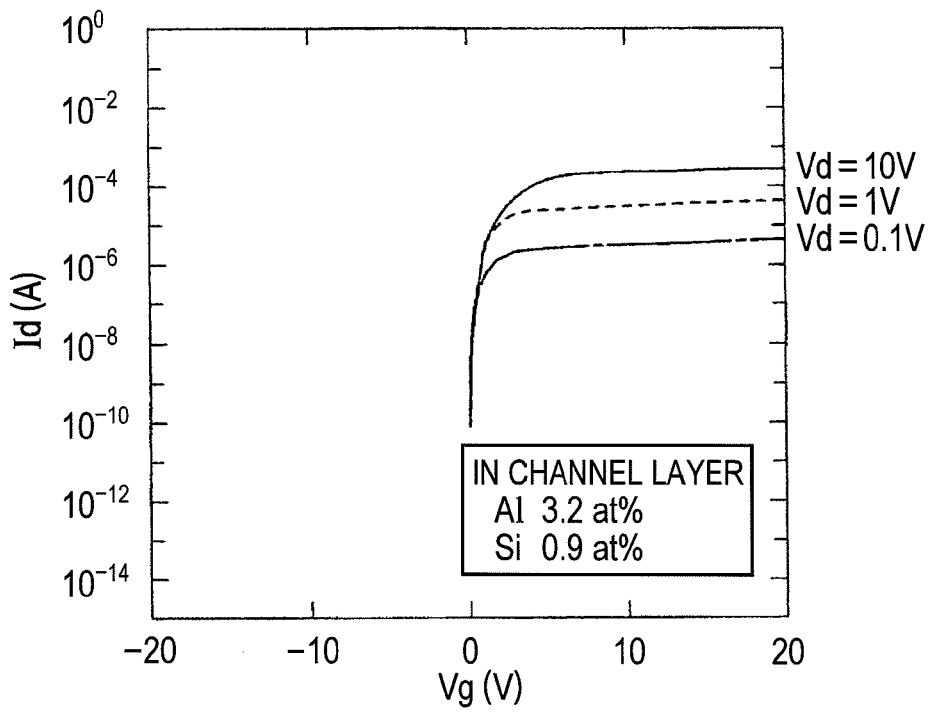
FIG. 5 is a graph showing transfer characteristics of a thin film transistor according to first embodiment of the invention, in which a ZTO film formed by using ZTO target with addition of a counter doping element is applied to a channel layer.

FIG. 5 shows a graph of drain current (Id)-gate voltage (Vg) characteristics of a thin film transistor according to the first embodiment in which a ZTO film formed by a sputtering method using a ZTO target with addition of a counter doping element is applied to a channel layer.

In a thin film transistor in which a ZTO film formed by using the ZTO target with addition of the counter doping element is applied to the channel layer although the impurity concentration of Al contamination in the channel layer is 3.2 at. %, good transistor characteristics having a sub-threshold slope value of 200 mV/dec or less were obtained.

Figure 6:
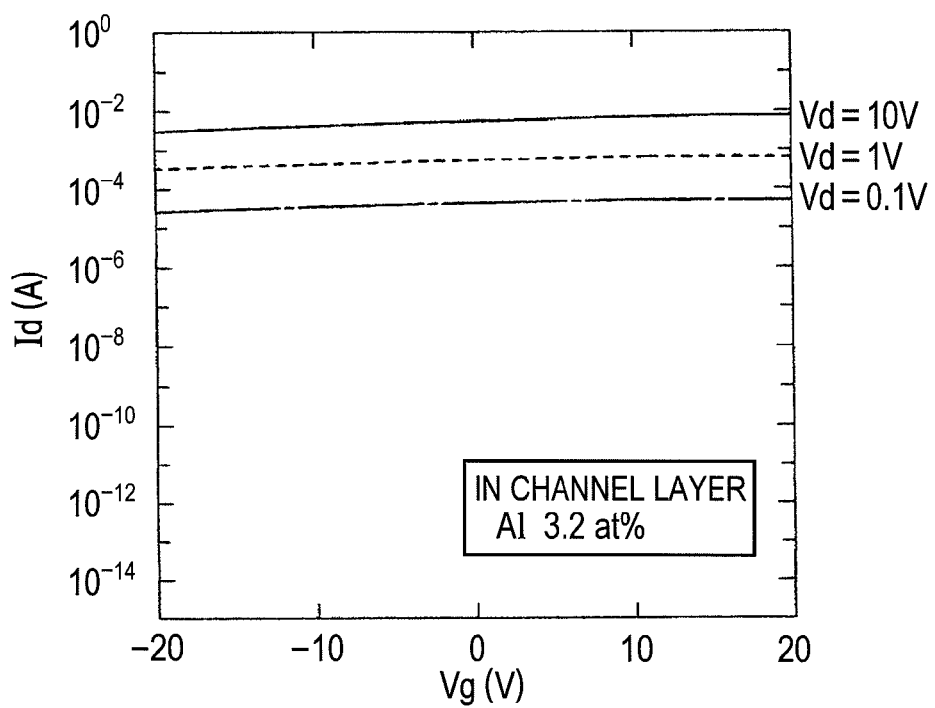
FIG. 6 is a graph showing transfer characteristics of a thin film transistor investigated by the inventors of the present application in which a ZTO film formed by using a ZTO target with no addition of the counter doping element is applied to a channel layer.

For comparison, FIG. 6 shows a graph of current (Id) voltage (Vg) characteristics of a thin film transistor in which a ZTO film formed by a sputtering method using a ZTO target with no addition of the counter doping element investigated by the inventors of the present application is applied to a channel layer.

The thin film transistor in which the ZTO film formed by using the ZTO target with no addition of the counter doping element is applied to the channel layer does not exhibit off operation and the current-voltage characteristics thereof are just like the characteristics of the thin film transistor in which an electroconductive film is applied to the channel layer.

Figure 7:
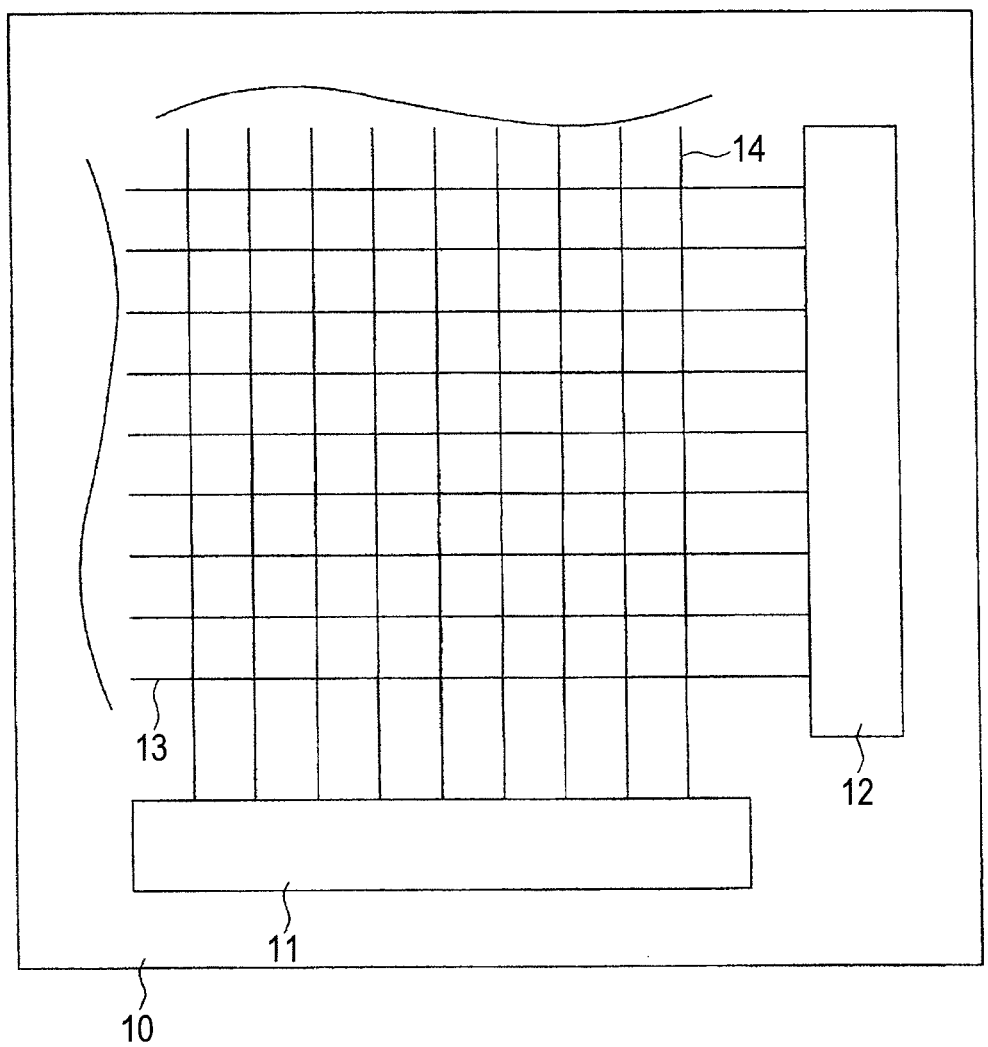
FIG. 7 is a simple configurational view of a driving circuit for an active matrix liquid crystal display according to the first embodiment of the present invention.
Figure 8:
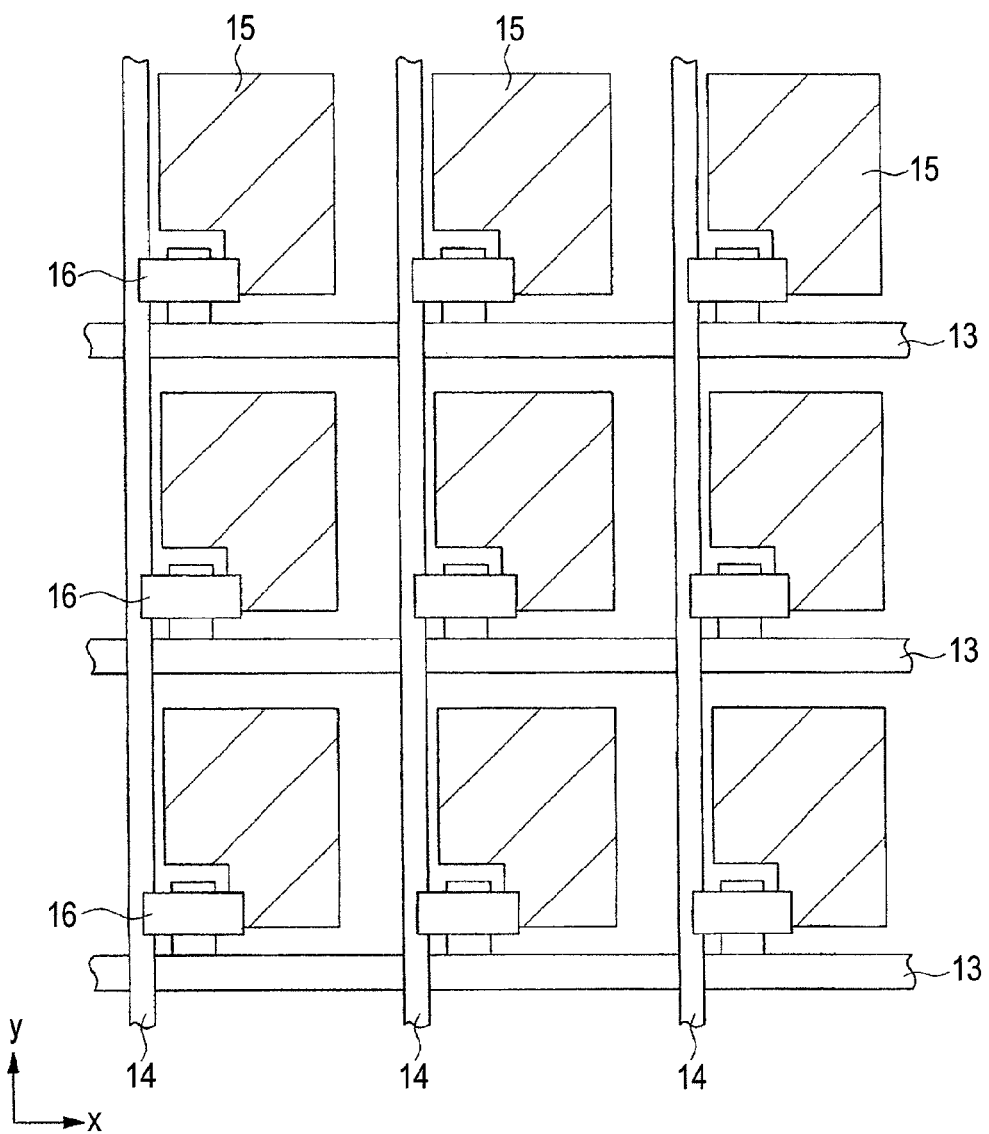
FIG. 8 is a plan view for a main portion showing an example of arrangement of a thin film transistor applied to a driving circuit for an active matrix type liquid crystal display device according to the first embodiment of the invention.

FIG. 7 and FIG. 8 shows a driving circuit for an active matrix liquid crystal display in which a thin film transistor having the transistor characteristics shown in FIG. 5 described above (thin film transistor in which the ZTO film formed by using the ZTO target with addition of the counter doping element is applied to the channel layer) is applied as a switching element on every pixel. FIG. 7 is a simple configurational view of the driving circuit for the active matrix liquid crystal display, and FIG. 8 is a plan view of a main portion showing an example of an arrangement of thin film transistors applied to the driving circuit for the active matrix liquid crystal display. In FIG. 7 and FIG. 8, numeral 10 denotes a support substrate, numeral 11 denotes a data line control circuit, numeral 12 denotes a gate line control circuit, numeral 13 denotes a gate line, numeral 14 denotes a data line, numeral 15 denotes a pixel electrode, and numeral 16 denotes a thin film switching transistor.

When the thin film transistor having the transistor characteristics as shown in FIG. 5 described above was applied to the driving circuit for the active matrix liquid crystal display, it was found that the thin film transistor had necessary characteristics and could withstand practical use for the active matrix liquid crystal display.

Figure 9:
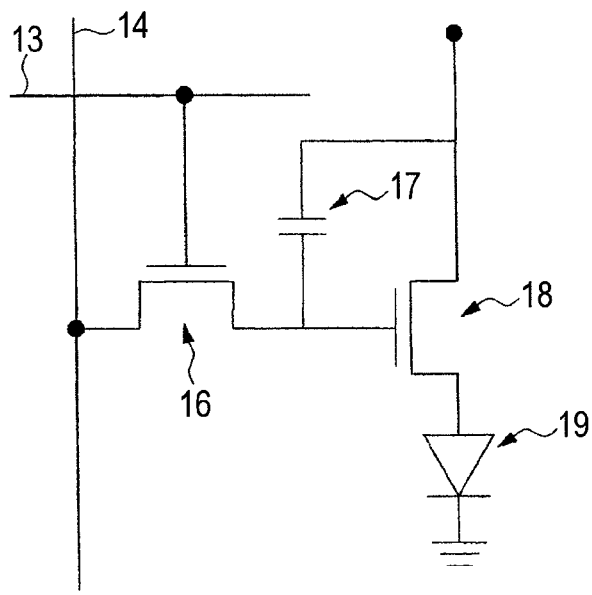
FIG. 9 is a circuit diagram of a driving circuit for an organic EL display according to the first embodiment of the invention.

FIG. 9 shows a driving circuit for an organic EL display in which the thin film transistor having the transistor characteristics shown in FIG. 5 described above (thin film transistor in which the ZTO film formed by using the ZTO target with addition of the counter doping element is applied to the channel layer) is used. In FIG. 9, numeral 13 denotes a gate line, numeral 14 denotes a data line, numeral 16 denotes a thin film switching transistor, numeral 17 denotes a buffer capacitor, numeral 18 denotes a current driving thin film transistor, and numeral 19 denotes an organic EL diode.

As shown in FIG. 9, the thin film transistor in which the ZTO film formed by using the ZTO target with addition of the counter doping element is applied to the channel layer is applicable also to the driving circuit for the organic EL display.

For the thin film transistor in which the ZTO film formed by using the ZTO target with addition of the counter doping element is applied to the channel layer, a production process for a large area and a high uniformity and at a low temperature can be realized, compared with a thin film transistor in which amorphous silicon is applied to the channel layer. Thus, since increase in the manufacturing cost of the display panel includes only increase in the cost regarding the process of forming the ZTO film, increase in the production cost of the display panel can be suppressed even when the thin film transistor in which the ZTO film formed by using the ZTO target with addition of the counter doping element is applied to the channel layer is adopted. Further, if the thin film transistor in which the amorphous silicon is applied to the channel layer in the liquid crystal display, it is necessary to incorporate, for example, a correction circuit for suppressing the fluctuation of the threshold voltage. However, when the thin film transistor in which the ZTO film formed by using the ZTO target with addition of the counter doping element is applied to the channel layer is used, the correction circuit is not necessary. Since the planarity at the periphery of the thin film transistor can be ensured, high fineness is attained relatively compared with the thin film transistor using amorphous silicon.

In the first embodiment, description has been made to a case where the Zn/(Zn+Sn) compositional ratio is 0.7 in the deposited ZTO film, but it is not particularly restricted to such compositional ratio and it may be in a range from 0.6 to 0.8, preferably, 0.65 to 0.7. Although the characteristics of the wet etching somewhat vary, substantially identical values can be obtained for the characteristics of the thin film transistor also by other Zn/(Zn+Sn) compositional ratios.

Further, as the method of depositing the ZTO film, while the RF magnetron sputtering method is shown as an example, identical results can be obtained also by an electron cyclotron resonance (ECR) sputtering method while forming a target in a ring-like configuration. Further, identical results can be obtained also by the film deposition method other than the sputtering method, for example, by a vapor deposition method. In addition, when pulse laser vapor deposition, etc. are used and a single crystal substrate that enables epitaxial growing is used, not only the thin film transistor but also oxide semiconductor single crystals and devices using them can be manufactured.

Further, in the first embodiment, an example of applying the present invention to the bottom gate top contact thin film transistor has been described, but it is not particularly restricted to such a structure and substantially identical characteristics can be obtained also by the thin film transistor having any of the structures including a bottom gate bottom contact type, a top gate top contact type or a top gate bottom contact type. Further, the thin film transistors can be utilized, also for example, for a driving circuit for an active matrix liquid crystal display, a driving circuit for an organic EL display, RFID tag, or stacked type semiconductor device, etc.

Further, in the first embodiment, the group IV single element (Si) is used as the counter doping element, but identical effects can be obtained also by using one of other single IV elements (carbon (C), Si, Ge), one of group V single elements (nitrogen (N), phosphorus (P), and arsenic (As)), or combination of group IV and group V elements.

As described above, according to the first embodiment, since the ZTO film formed by the sputtering method using the ZTO target with addition of the counter doping element is applied to the channel layer of the thin film transistor (bottom gate top contact thin film transistor), a thin film transistor having a sub-threshold slope value, for example, of 200 mV/dec or less and with less fluctuation of the threshold voltage can be provided.

Second Embodiment

Figure 10:
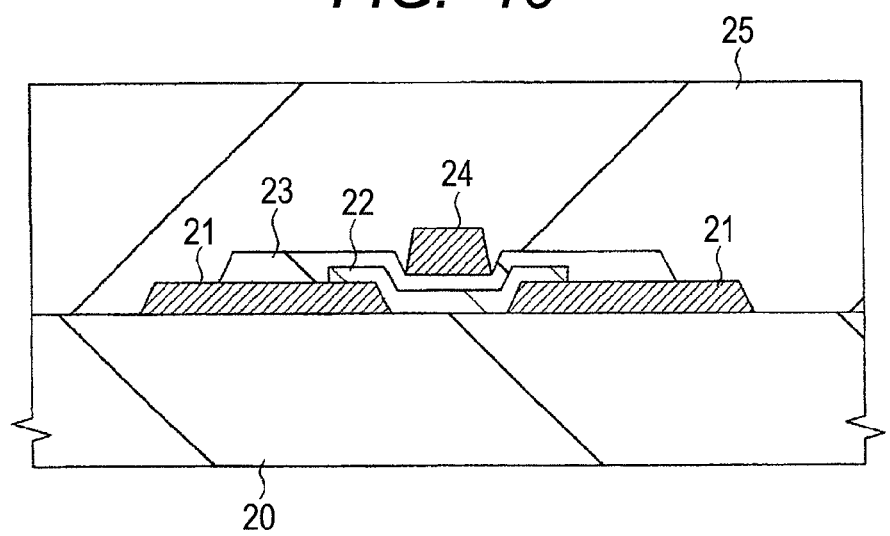
FIG. 10 is a cross sectional view of a main portion of a top gate bottom contact thin film transistor according to a second embodiment of the invention.
Figure 11:
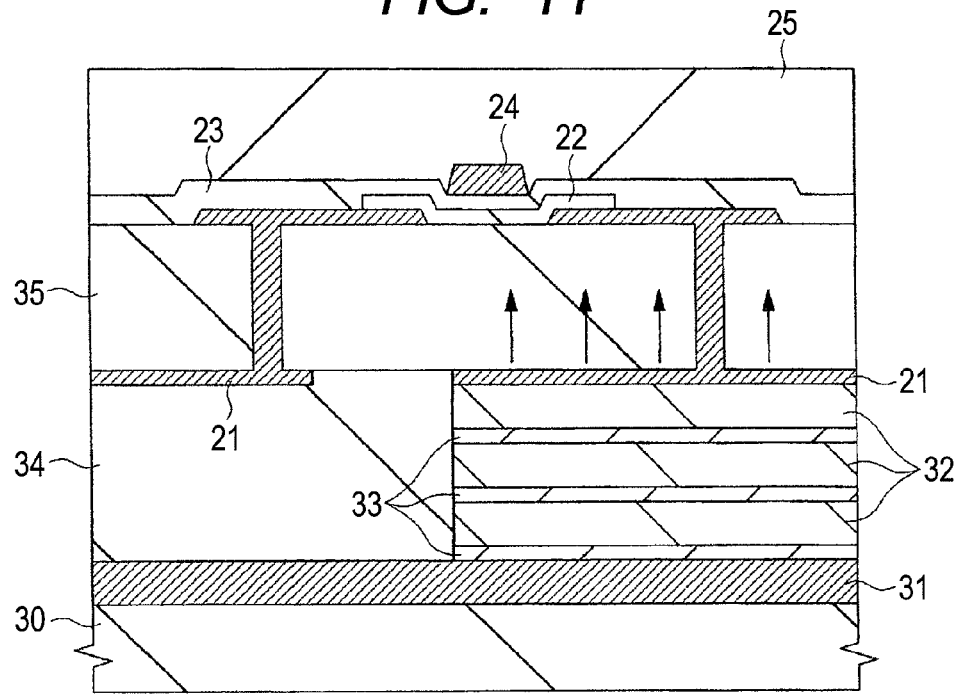
FIG. 11 is a cross sectional view of a main portion showing a structure in which a top gate bottom contact thin film transistor and a top emission organic EL illumination device are integrated according to the second embodiment of the invention.
Figure 12:
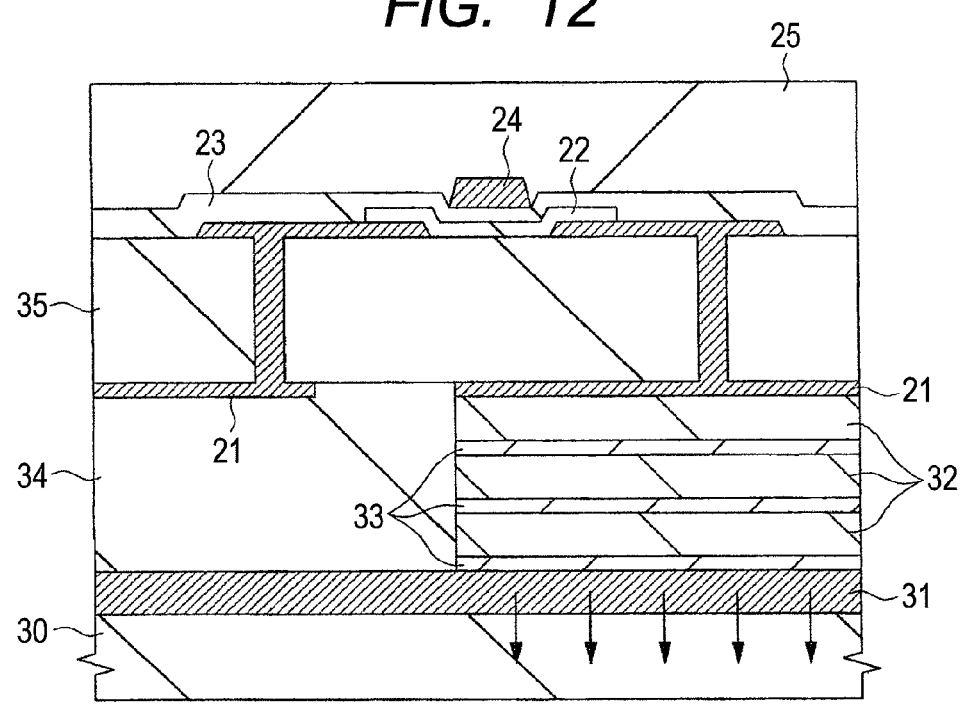
FIG. 12 is a cross sectional view of a main portion showing a structure in which a top gate bottom contact thin film transistor and a bottom emission organic EL illumination device are integrated according to the second embodiment of the invention.

A structure of a thin film transistor according to second embodiment is to be described with reference to FIG. 10 to FIG. 12. FIG. 10 is a cross sectional view of a main portion of a top gate bottom contact thin film transistor, FIG. 11 is a cross sectional view of a main portion showing an integrated structure of atop gate bottom contact thin film transistor and a top emission organic EL illumination element, and FIG. 12 is a cross sectional view of a main portion showing an integrated structure of a top gate bottom contact thin film transistor and a bottom emission organic EL illumination device.

Also in the second embodiment, a ZTO film is formed by using a ZTO target in the same manner as in the first embodiment described above. However, an impurity (for example, Al (group III element)) at about 0.3 to 3.2 at. % intrudes in the manufacturing process. Then, a ZTO target is manufactured by admixing a silicon nitride ($Si_3N_4$) powder or a boron nitride (BN) powder as the counter doping material by about $1/10$ based on concentration of the Al impurity.

A ZTO film to be applied to a channel layer of a thin film transistor is formed by an electron beam vapor deposition method using a ZTO target. A film deposition rate of about 5 nm/min is obtained under the conditions at an acceleration voltage of 6 kV and at a beam current of 70 mA. In the film deposition method, since there is less damage to the boundary caused by ion implantation or the like, a thin film transistor of good quality can be formed even when the substrate temperature is at a room temperature. For increasing the film density of the ZTO film, irradiation of oxygen ions, etc. may be performed simultaneously during film deposition.

Then, the structure of the thin film transistor according to the second embodiment is to be described with reference to the cross sectional view of a main portion shown in FIG. 10. In FIG. 10, numeral 20 denotes a support substrate, numeral 21 denotes a source-drain electrode, numeral 22 denotes a channel layer, numeral 23 denotes a gate insulating film, numeral 24 denotes a gate electrode, and numeral 25 denotes a passivation film.

Two source-drain electrodes 21 (electrode that function as source electrode or drain electrode) including a transparent electroconductive film such as an ITO film, IZO film, AZO film, or GZO film are formed with a predetermined distance therebetween over the main surface of the support substrate 20, for example, a glass substrate, quartz substrate, resin substrate, or a film. The transparent electroconductive film is formed by a vapor deposition method, a sputtering method, or the like, and the source-drain electrodes 21 are formed by fabricating the transparent electroconductive film by photolithography and wet etching.

A channel layer 22 including a ZTO film is formed over the main surface of the support substrate 20 between the two adjacent source-drain electrodes 21 riding over at both ends thereof on the two source and drain electrodes 21 respectively. The ZTO film is formed by an electron beam vapor deposition method using a ZTO target with addition of a counter doping element and the channel layer 22 is formed by fabricating the ZTO film by photolithography and wet etching. The thickness of the channel layer 22 is, for example, about 50 nm.

A gate insulating film 23 is formed to a layer over the channel layer 22. The gate insulating film 23 includes, for example, an oxide film (for example, a silicon oxide film), a nitride film (for example, a silicon nitride film), etc. and the thickness thereof is, for example, about 100 nm.

A gate electrode 24 including a transparent electroconductive film, for example, an ITO film, IZO film, AZO film, or GZO film is formed between the two adjacent source-drain electrodes 21 to a layer above the gate insulating film 23. The transparent electroconductive film is formed by a vapor deposition method or the sputtering method, and the gate electrode 24 is formed by fabricating the transparent electroconductive film by photolithography and wet etching. The thickness of the gate electrode 24 is, for example, about 200 nm.

A passivation film 25 is formed over the main surface of the support substrate 20 so as to cover the gate electrode 24, the gate insulating film 23, and the source-drain electrodes 21.

Since such a thin film transistor can be manufactured substantially at a room temperature throughout the manufacturing process, this is suitable to integration with an organic EL illumination device.

FIG. 11 shows an example of an integrated structure in which a top gate bottom contact thin film transistor is formed over a matrix substrate where a top emission organic EL illumination device of a multi-unit structure is formed. In FIG. 11, numeral 21 denotes source-drain electrodes, numeral 22 denotes a channel layer, numeral 23 denotes a gate insulating film, numeral 24 denotes a gate electrode, numeral 25 denotes a passivation film, numeral 30 denotes a support substrate, numeral 31 denotes a counter electrode, a numeral 32 denotes an organic EL layer, numeral 33 denotes an intermediate layer, numeral 34 denotes an interlayer insulating film (planarizing film), and numeral 35 denotes an interlayer insulating film that serves also as a support substrate.

In a top emission organic EL illumination device, a thin film transistor of high transmittance is desirable. For example, a transparent electroconductive film of high transmittance, for example, an ITO film, IZO film, AZO film, GZO film, boron-doped zinc oxide (BZO) film, or cerium oxide ($CeO_2$)-added AZO film is necessary for the gate electrode 24 and the source-drain electrodes 21. The thickness of the transparent electroconductive film is, for example, 200 to 400 nm. The counter electrode 31 formed over the main surface of the support substrate 30 may either be a metal electrode or a transparent electrode.

FIG. 12 shows an example of an integrated structure in which a top gate bottom contact thin film transistor is formed over a matrix substrate on which a bottom emission organic EL illumination device of a multi-unit structure is formed. In FIG. 12, numeral 21 denotes source-drain electrodes, numeral 22 denotes a channel layer, numeral 23 denotes a gate insulating film, numeral 24 denotes a gate electrode, numeral 25 denotes a passivation film, numeral 30 denotes a support substrate, numeral 31 denotes a counter electrode, numeral 32 denotes an organic EL layer, numeral 33 denotes an intermediate layer, numeral 34 denotes an interlayer insulating film (planarizing film), and numeral 35 denotes an interlayer insulation film that serves also as a support substrate.

In the bottom emission organic EL illumination device, a metal material is applicable to the gate electrode 24 and the source-drain electrodes 21. For example, the gate electrode 24 can be formed of an Mo film (200 nm thickness) and the source-drain electrode 21 can be formed of a stacked metal layer including an Al film (150 nm thickness) and a Co film (50 nm thickness). However, a transparent electroconductive film of high transmittance, for example, an ITO film, IZO film, AZO film, GZO film, BZO film, or $CeO_2$-added, AZO film is necessary for the counter electrode 31 formed over the main surface of the support substrate 30. The thickness of the transparent electroconductive film is, for example, 200 to 400 nm.

When the thin film transistor is used in a light control circuit for an organic EL illumination device, a thin film transistor having, for example, a gate length of 100 μm and a gate width of 1 mm is used. In the thin film transistor, fluctuation of a threshold voltage is suppressed to 0.5 V or less in continuous use over 2,000 hours and good values are obtained also for other basic characteristics, for example, a mobility of 20 cm²/Vs or more and an on-off ratio of $10^6$ or more.

Figure 13:
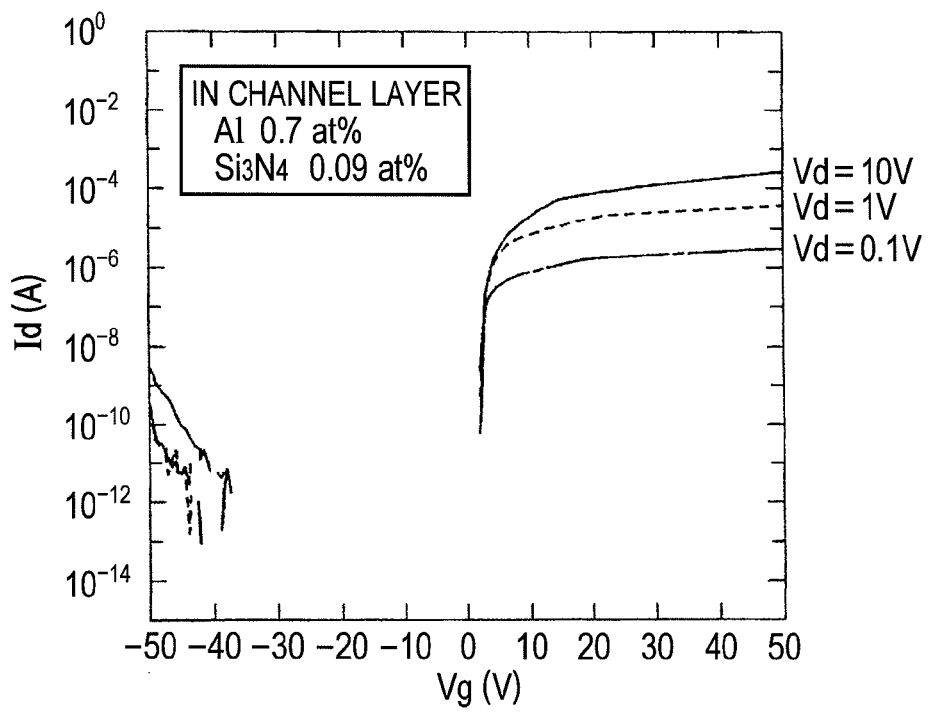
FIG. 13 is a graph showing transfer characteristics of a thin film transistor in which a ZTO film formed by an electron beam deposition method using a ZTO target with addition of a counter doping material ($Si_3N_4$) is applied to a channel layer according to the second embodiment of the invention.
Figure 14:
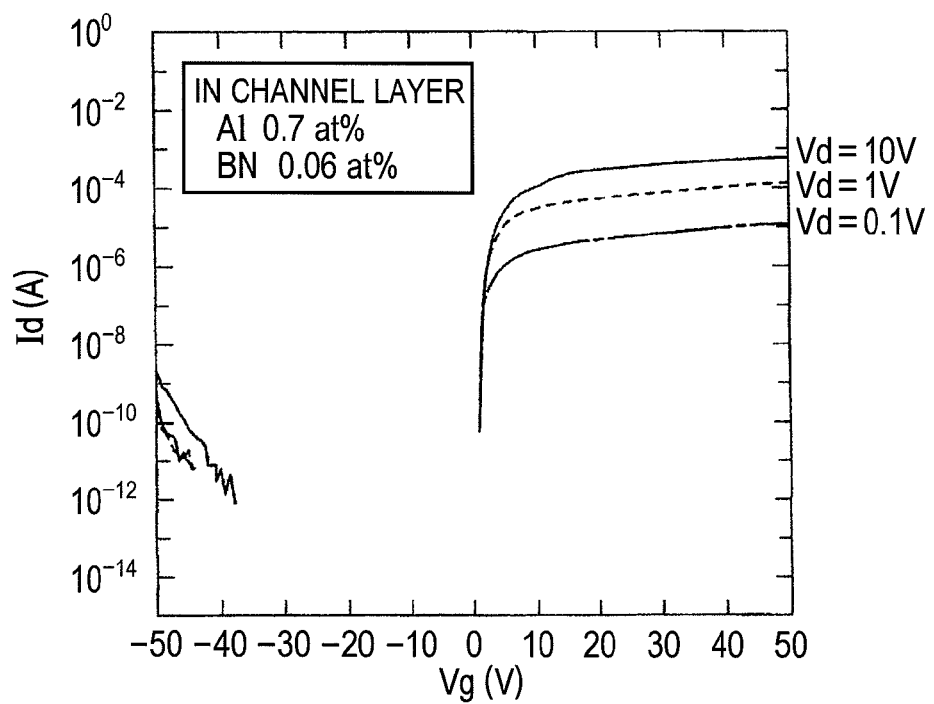
FIG. 14 is a graph showing transfer characteristics of a thin film transistor in which a ZTO film formed by an electron beam deposition method using a ZTO target with addition of a counter doping material (BN) is applied to a channel layer according to the second embodiment of the invention.

FIG. 13 is a graph showing current (Id)-voltage (Vg) characteristics of a thin film transistor in which a ZTO film formed by an electron beam vapor deposition method using a ZTO target with addition of $Si_3N_4$ as a counter doping material is applied to the channel layer, and FIG. 14 is a graph showing current (Id)-voltage (Vg) characteristics of a thin film transistor in which a ZTO film formed by the electron beam vapor deposition method using a ZTO target with addition of BN as the counter doping material is applied to the channel layer.

As shown in FIG. 13, in the thin film transistor in which a ZTO film containing Si and N counter doping elements was applied to the channel layer, a good sub-threshold slope value of 200 mV/dec or less was obtained. As a result of compositional analysis, the impurity concentration of Al was 0.7 at. % and the impurity concentration of Si and N in total was 0.09 at. % in the channel layer.

Further, as shown in FIG. 14, in the thin film transistor in which a ZTO film containing B and N counter doping elements was applied to the channel layer, a good sub-threshold slope value of 300 mV/dec or less was obtained. As a result of compositional analysis, the impurity concentration of Al was 0.7 at. % and the impurity concentration of B and N in total was 0.06 at. % in the channel layer.

Figure 15:
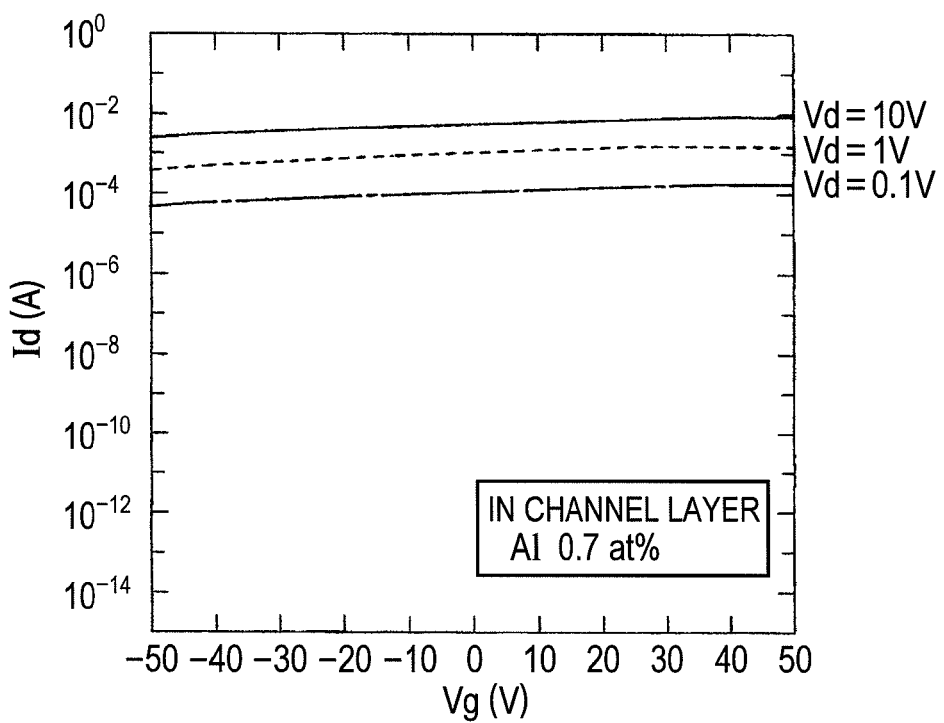
FIG. 15 is a graph showing transfer characteristics of a thin film transistor investigated by the inventors of the present application in which a ZTO film formed by an electron beam vapor deposition method using a ZTO target with no addition of a counter doping element is applied to a channel layer.

For comparison, FIG. 15 shows a graph showing current (Id)-voltage (Vg) characteristics of a thin film transistor in which a ZTO film formed by an electron beam vapor deposition method using a ZTO target with no addition of the counter doping element investigated by the inventors of the present application is applied to a channel layer.

The thin film transistor of in which the ZTO film formed by using the ZTO target with no addition of the counter doping element is applied to the channel layer does not exhibit off operation and the current-voltage characteristics thereof are just like the characteristics of a thin film transistor in which an electroconductive film is applied to a channel layer.

The thin film transistor according to the second embodiment has an excellent adaptability to an integrated structure with an organic EL illumination device as an active matrix array and is applicable to organic EL illumination and, in addition, to inorganic EL illumination, etc. FIG. 11 and FIG. 12 described above show examples of the basic structure of organic EL illumination using the thin film transistor according to the second embodiment as an illumination controlling transistor. Since a white organic EL illumination device of a multi-unit structure has a planar structure with a size, for example, of 1 mm×1.5 mm or more, and the transmittance of the thin film transistor per se is 85% or more, the thin film transistor present on the emission side results no practical problem.

Further, by the control for the active matrix utilizing the thin film transistor according to the second embodiment, light control for the organic EL illumination device is possible. That is, while considering the organic EL illumination device as a pixel and by switching off a portion of pixels, the amount of light can be controlled. A simulative seamless control is also possible by preparing dynamic or static on-off pattern and arranging them in the order of the amount of light.

Further, since such light control can also provide a pixel control function, fracture of the organic EL illumination device caused by ununiformity of film deposition of the organic EL material, which may become a problem in the organic EL illumination can be prevented and this is effective also for extending the life of organic EL illumination.

Further, a structure of refining the organic EL device in which the thin film transistor and the organic EL device are integrated substantially in the same configuration as the organic EL illumination is Applicable to the organic EL display.

In the second embodiment, combination of the group V element (Si, B) and the group V element (N) was used as the counter doping material, but identical effects can be obtained also by one of other single group IV elements (C, Si, Ge), one of other single group V elements (N, P, As), or combination of the group IV elements and the group V element.

Further, in the second embodiment, the ZTO film applied to the channel layer of the thin film transistor was formed by using the ZTO target with addition of the counter doping material and, for example, by an electron beam vapor deposition method. However, the film deposition method of the ZTO film is not restricted thereto. For example, after forming a ZTO film by an electron beam vapor deposition method using a ZTO target with no addition of the counter doping material, an appropriate amount of a counter doping element (for example, C, Si, Ge, N, P, As, or compounds thereof) to the impurity concentration of the group III element can be added to the ZTO film by an ion implantation method, a gas phase diffusion method, or a solid phase diffusion method.

For example, after forming a ZTO film by using a ZTO target with no addition of the counter doping material and then ion implanting a counter doping element (for example, Ge, P) to the surface of the ZTO film under an acceleration voltage of 20 keV, a heat treatment may be performed at about 300° C. Further, a ZTO film may be formed by using a ZTO target with no addition of the counter doping material, and the counter doping element may be diffused in a gas phase to the ZTO film under heating at 300 to 400° C. by using a monosilane ($SiH_4$) gas, germane ($GeH_4$) gas, phosphine ($PH_3$) gas, etc. Also the thin film transistor in which the ZTO film with addition of the counter doping element is applied to the channel layer in the manner as described above can provide effects identical with those of the thin film transistor in which the ZTO film formed by using the ZTO target with addition of the counter doping material is applied to the channel layer.

Further, in the second embodiment, the zinc tin complex oxide was described mainly for the channel layer, but the identical effects can be expected also for other oxide semiconductor materials, for example, indium zinc tin composite oxide, tin oxide, gallium oxide, tungsten oxide, titanium oxide, indium zinc composite oxide, indium gallium zinc composite oxide, etc.

Further, in the second embodiment, a configuration of forming the thin film transistor over the organic EL illumination device was exemplified as a structure in which the thin film transistor and the organic EL illumination device were integrated, but this is not restrictive and a configuration of forming the organic EL illumination device over the thin film transistor may also be used.

As described above, according to the second embodiment, since the ZTO film formed by a sputtering method using the ZTO target with addition of the counter doping element is applied to the channel layer of the thin film transistor (top gate bottom contact thin film transistor), a thin film transistor, for example, having a sub-threshold slope value of 200 mV/dec or less and with less fluctuation of the threshold voltage can be attained in the same manner as the first embodiment.

Further, by forming the thin film transistor with a transparent material such as a transparent electroconductive film, the thin film transistor is applicable, for example, to the organic EL illumination device or the organic EL display. When the thin film transistor is used for light control of the organic EL illumination device, since the pixel control function can be provided by light control, fracture of the organic EL illumination device can be prevented.

Third Embodiment

Figure 16:
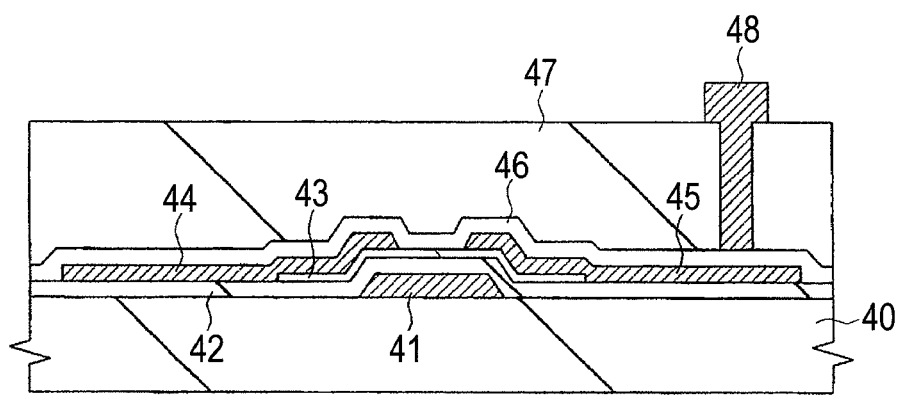
FIG. 16 is a cross sectional view of a main portion showing a structure of an anti-fuse memory using a thin film transistor according to a third embodiment of the invention.
Figure 17:
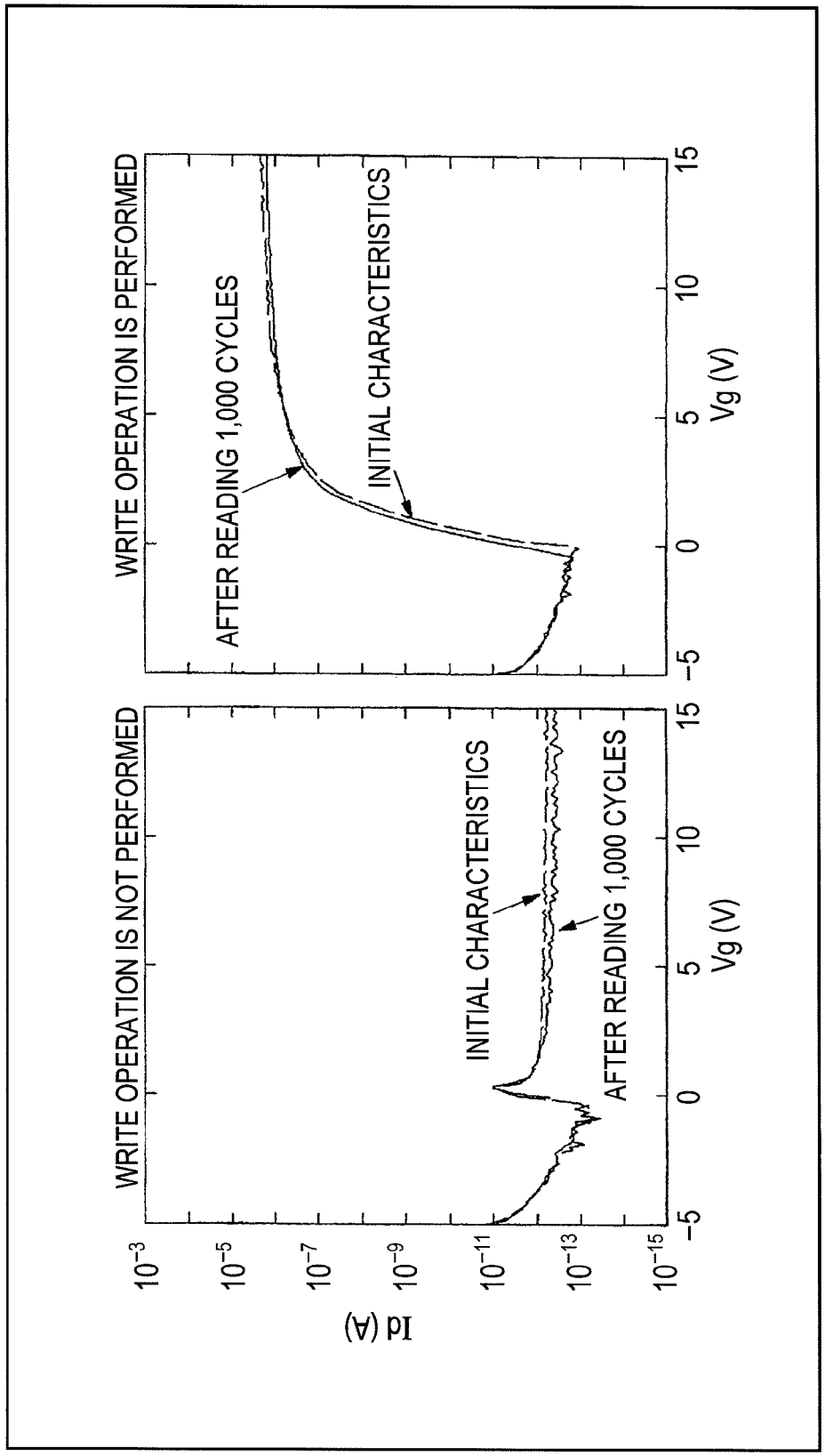
FIG. 17 is a graph for explaining the operation of the anti-fuse memory shown in FIG. 16.
Figure 18:
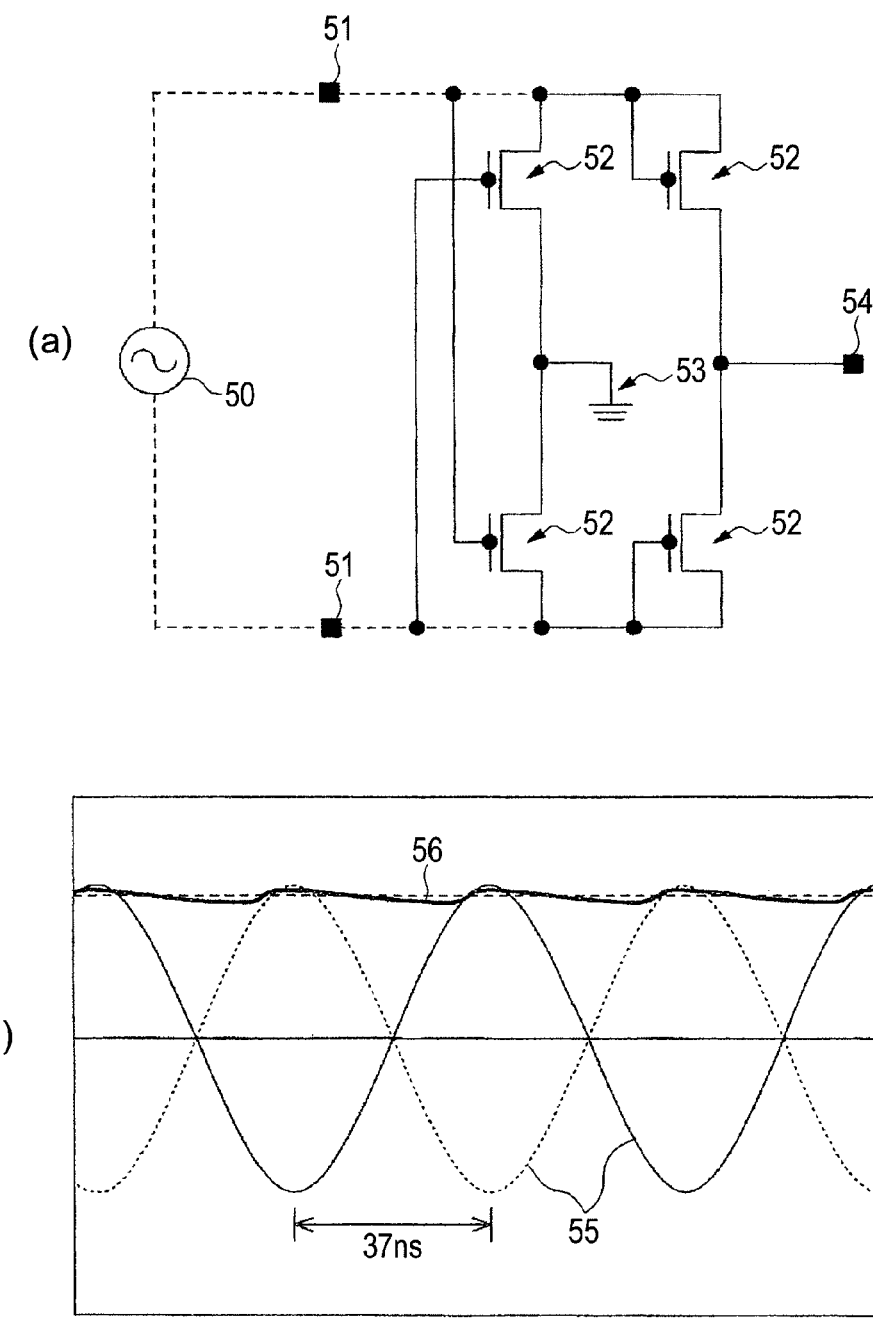
FIG. 18 (a) is a circuit diagram showing an example of a rectifying circuit using the thin film transistor according to the third embodiment of the invention, and (b) is a graph for explaining the rectifying operation of the rectifying circuit at a high frequency of 13.56 MHz.
Figure 19:
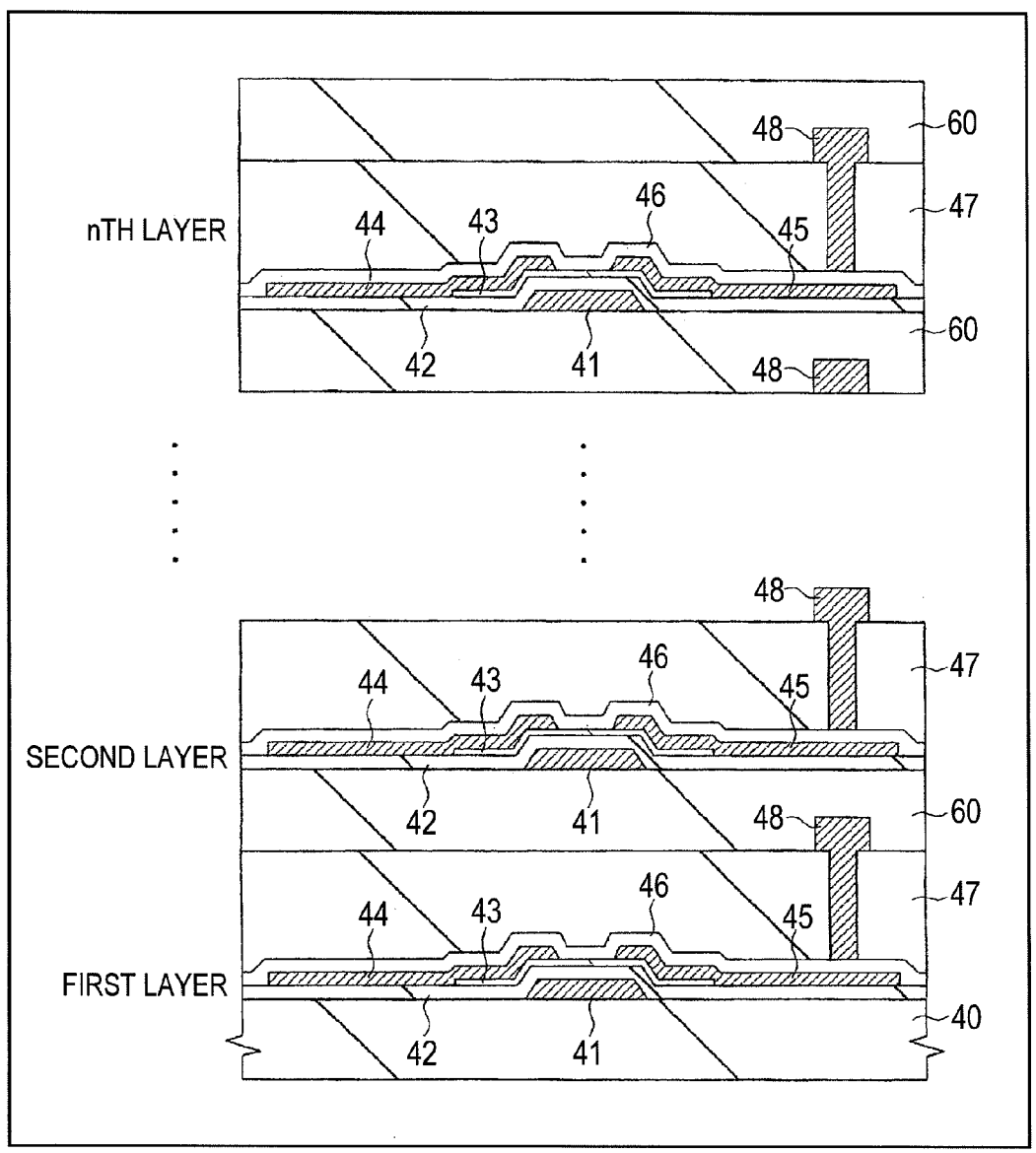
FIG. 19 is a cross sectional view of a main portion showing a structure in which a plurality of thin film transistors are stacked according to the third embodiment of the invention.

Various devices or circuits using the thin film transistor according to a third embodiment are to be described with reference to FIG. 16 to FIG. 20. FIG. 16 is a cross sectional view of a main portion showing a structure of an anti-fuse memory using a thin film transistor, FIG. 17 is a graph for explaining the operation of the anti-fuse memory shown in FIG. 16, FIGS. 18(a) and (b) are a circuit diagram showing an example of a rectifying circuit using the thin film transistor and a graph for explaining the rectifying operation of the rectifying circuit at a high frequency of 13.56 MHz, FIG. 19 is a cross sectional view of a main portion showing a structure in which a plurality of thin film transistors are stacked, and FIGS. 20(a) and (b) are a circuit diagram showing an example of a temperature measuring circuit using the thin film transistor and a cross sectional view of a main portion showing a portion of a structure in which the thin film transistor constituting the temperature measuring circuit and a temperature measuring diode are connected.

FIG. 16 is a cross sectional views of a main portion showing a structure of an anti-fuse memory using a bottom gate top contact thin film transistor. In FIG. 16, numeral 40 denotes a support substrate, numeral 41 denotes a gate electrode, numeral 42 denotes a gate insulating film, numeral 43 denotes a channel layer, numeral 44 denotes a source electrode, numeral 45 denotes a drain electrode, numeral 46 denotes an insulating film (passivation film), numeral 47 denotes an interlayer insulating film (planarizing film), and numeral 48 denotes a write once electrode The basic configuration of the anti-fuse memory is identical with the thin film transistor of the first embodiment described above (refer to FIG. 3), in which an insulating film 46 is provided between a drain electrode 45 and an interlayer insulating film 47, and an electrode 48 for write once operation is formed as far as the insulating film 46.

When a voltage, for example, of about 5 to 15 V is applied between the electrode 48 for write once operation and the drain electrode 45, the insulating film 46 undergoes dielectric breakdown and a normally conductive state is obtained between the write once electrode 48 and the drain electrode 45. The writing operation is possible for once. Accordingly, by arranging thin film transistors in a matrix and performing the operation described above, an anti-fuse memory enabling once writing is obtained.

An anti-fuse memory of 128 bits was manufactured experimentally utilizing the thin film transistor explained in the first embodiment. The channel layer 43 of the thin film transistor is a ZTO film formed by a sputtering method using a ZTO target with addition of the counter doping element and the thickness thereof is 25 nm. The gate electrode 41 includes a tungsten (W) film and the thickness thereof is 200 nm. The gate insulating film 42 is an oxide film (for example, silicon oxide film) formed by a CVD method and the thickness thereof is 80 nm. The source electrode 44 and the drain electrode 45 are a stacked metal film including an Al film and a Co film in which the thickness of the Al film is 150 nm and the thickness of the Co film is 5 nm. The insulating film 46 is an oxide film (silicon oxide film) formed by an electron beam vapor deposition method and the thickness thereof is 80 nm. The electrode 48 for once writing is an Al film.

FIG. 17 shows a graph for explaining a relation between a drain current and a gate voltage of an anti-fuse memory in a case where writing operation is not performed and a case where the writing operation is performed.

When the writing operation is not performed, this is a non-conductive state and, when the writing operation is performed, this is a conductive state in which the usual transistor operation can be confirmed. A stable operation can be confirmed even after reading for 1,000 cycles or more. The cost of the memory of this type can be reduced to about 1/100 compared with the memory using an Si semiconductor and can withstand practical use as a memory for a RFID tag.

Further, since the anti-fuse memory can be manufactured easily by a thin film process, when a plurality of identical anti-fuse memories are arranged on one identical substrate, not only once writing but also plural times of writing are possible by the number of arrangement.

FIGS. 18(a) and (b) are a circuit diagram showing an example of a rectifying circuit using a thin film transistor and a graph for explaining the rectifying operation at a high frequency of 13.56 MHz respectively. In FIG. 18(a), numeral 50 denotes an a high frequency power source or a receiving antenna, numeral 51 denotes an antenna terminal, numeral 52 denotes a thin film transistor, numeral 53 denotes a ground, and numeral 54 denotes an output terminal (load circuit connection terminal). Further, in FIG. 18(b), numeral 55 denotes a high frequency input waveform and numeral 56 denotes a rectified output waveform.

The basic structure of the thin film transistor is identical with the bottom gate top contact thin film transistor shown in FIG. 4(e) described above. The channel layer is a ZTO film formed by a sputtering method using a ZTO target with addition of the counter doping element and the thickness thereof is 25 nm. The gate electrode is a W film and a thickness thereof is 200 nm. The gate insulating film is an oxide film (for example, silicon oxide film) formed by a CVD method and the thickness thereof is 80 nm. The source and drain electrodes are formed of a stacked metal film including an Al film and a Co film in which the thickness of the Al film is 150 nm and the thickness of the Co film is 5 nm. The passivation film includes an oxide film (silicon oxide film) and a photosensitive polyimide film formed by a CVD method in which the thickness of the oxide film is 80 nm and the thickness of the photosensitive polyimide film is 1 µm.

The rectifying circuit shown in FIG. 18(a) is formed by using the thin film transistor. When a high frequency of 13.56 MHz was applied and the rectifying operation was evaluated, a full wave rectification could be confirmed as shown in FIG. 18(b) and an output at about 5 V relative to an amplitude ±10 V could be always confirmed. Further, an antenna having a sufficient gain was provided to the rectifying circuit and wireless evaluation was performed. As a result, a DC output of 12 V at the maximum could be obtained as a power source circuit for an RFID tag, etc. by using a reader/writer of 200 mW output.

Further, a passive type RFID tag can be fabricated on a card-like resin substrate using the thin film transistor. The inventors of the present application formed an HF band passive RFID tag only by a thin film process by utilizing the rectifying circuit shown in FIG. 18(a) and a resonance circuit formed of a ring oscillator using the thin film transistor and utilizing an anti-fuse memory shown in FIG. 16 described above as ID information. As a result of measurement, transmission and reception could be confirmed in an HF band containing 13.56 MHz.

For the anti-fuse memory generating ID information, plural times of writing are possible by previously arranging a plurality of anti-fuse memories. Further, for the resonance circuit, transmission and reception in a UHF band are possible by providing a frequency converter circuit. Further, as an additional feature, since most of the portions can be formed of a transparent material except for the electrode portion, an RFID tag not deteriorating the card design can be attained. Further, a substantially transparent RFID tag can also be attained by using a transparent support substrate and forming the interconnects and the electrodes with transparent electroconductive film, etc.

FIG. 19 is a cross sectional view of a main portion for explaining an example of a device in which a large number of thin film transistors are stacked and integrated. In FIG. 19, numeral 40 denotes a support substrate, numeral 41 denotes a gate electrode, numeral 42 denotes a gate insulating film, numeral 43 denotes a channel layer, numeral 44 denotes a source electrode, numeral 45 denotes a drain electrode, numeral 46 denotes an insulating film (passivation film), numeral 47 denotes an interlayer insulating film (planarizing film), numeral 48 denotes once write electrode, and numeral 60 denotes an interlayer insulating film.

The basic structure of the thin film transistor is identical with the anti-fuse memory shown in FIG. 16 described above. Improvement in the integration degree can be expected by using a glass substrate, a resin film, or a thin metal film decreased in the thickness to about 5 to 50 μm for the support substrate 40. Further, by mounting circuits necessary for practical use on every layer, not only reduction in the thickness but also further decrease in the size of the device can be expected. For example, by mounting the RFID tag in a multilayer, an HF band RFID tag of 200 μm in thickness and a planar size of 2 mm×2 mm can be obtained.

Figure 20:
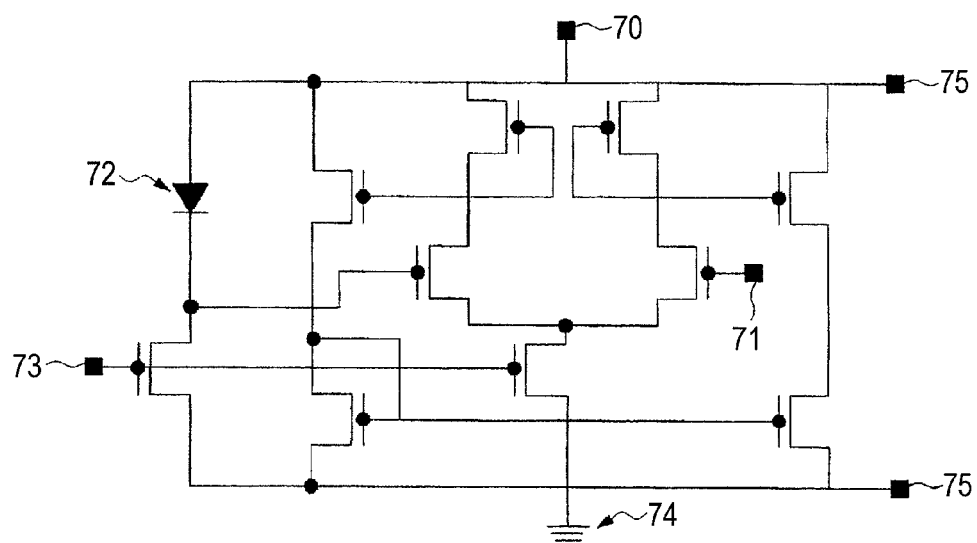
FIG. 20 (a) is a circuit diagram showing an example of a temperature measuring circuit using the thin film transistor according to the third embodiment of the invention and (b) is a cross sectional view of a main portion showing a portion of a structure in which a thin film transistor configuring the temperature measuring circuit and a diode for temperature measurement are connected.
Figure 20:
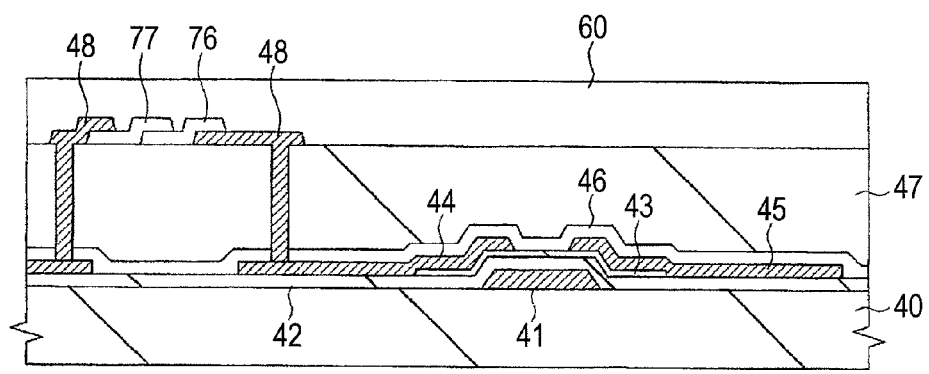

FIGS. 20(*a*) and (*b*) are a circuit diagram showing an example of a temperature measurement circuit using thin film transistors and a cross sectional view of a main portion showing a portion of a structure in which the thin film transistor and the temperature measuring diode forming the circuit are connected. In FIG. 20(*a*), numeral 70 denotes an input terminal, numeral 71 denotes a numeral voltage terminal, numeral 72 denotes an oxide semiconductor diode for temperature measurement, numeral 73 denotes temperature calibration numeral voltage, numeral 74 denotes a ground, and numeral 75 denotes an output terminal. In FIG. 20(*b*), numeral 40 denotes a support substrate, numeral 41 denotes a gate electrode, numeral 42 denotes a gate insulating film, numeral 43 denotes a channel layer, numeral 44 denotes a source electrode, numeral 45 denotes a drain electrode, numeral 46 denotes an insulating film (passivation film), numeral 47 denotes an interlayer insulating film (planarizing film), numeral 48 denotes a write once electrode, numeral 60 denotes an interlayer insulating film, numeral 76 denotes an n-type oxide semiconductor, and numeral 77 denotes a p-type oxide semiconductor.

A pn junction diode (oxide semiconductor diode 72 for temperature measurement) is formed of a p-type oxide semiconductor 77 and an n-type oxide semiconductor 76 formed by a film deposition technique. The p-type oxide semiconductor 77 is, for example, $SnO_x$ and the n-type oxide semiconductor 76 is, for example, ZnO. A temperature measuring device of a large area and at a low cost can be attained by using the pn junction diode as a diode for temperature measurement and applying the thin film transistor as principal transistors. The basic structure of the thin film transistor is identical, for example, with the bottom gate top contact thin film transistor shown in FIG. 16 described above.

Further, most of the electrodes (gate electrode 41, source electrode 44, drain electrode 45, etc.), the channel layer (channel layer 43), and the insulating film (gate insulating film 42, insulating film 46, etc.) of the thin film transistor can be formed of an oxide material having a transmittance of 90% or higher. Thus, by forming the temperature measurement circuit according to the third embodiment, for example, to the inner surface or the outer surface of a polysilicon and single crystal Si solar battery panel, a solar battery panel capable of temperature measurement for every cell can be attained.

In solar battery cells used at present, since the temperature characteristics are different greatly depending on the materials for substrate or manufacturing steps, a necessary output cannot sometimes be obtained by merely connecting a plurality of solar battery cells in series and parallel. That is, in existent solar battery modules not performing the temperature measurement for every cell, the output loss due to increase in the serial resistance resulted from connecting the solar battery cells of temperature characteristics different from each other. Then, temperature is measured for every cell by using the temperature measuring circuit according to the third embodiment, and correction and control for the output characteristics are performed by recognizing the temperature characteristics of the solar battery cell. Thus, the output can be improved by 10 to 20% or more than that of the existent solar battery modules not measuring the temperature for every cell. Further, since the temperature measuring circuit according to the third embodiment has a large area and can be manufactured at a low cost, there is no possibility of increasing the cost of the solar battery module.

In addition, by forming a temperature sensor including the temperature measuring circuit according to the third embodiment directly to a glass surface, an environment measuring device in which the temperature sensor is incorporated in the glass surface can be provided. Thus, the environment measuring device can be adopted as a multipoint sensor for the control of air conditioning in automobiles, electric trains, aircrafts, buildings, residential buildings, etc. with no undesired effects on the design thereof.

The invention made by the present inventors has been described specifically based on the preferred embodiments, but it will be apparent that the present invention is not restricted to the embodiments described above and can be modified variously within the range not departing the gist thereof.

INDUSTRIAL APPLICABILITY

The present invention is applicable to an oxide semiconductor device (oxide semiconductor thin film transistor) used for electronic devices such as FPD, organic EL illumination, solar battery, or RFID.

LIST OF REFERENCE NUMERALS

1 support substrate
2 gate electrode
3 gate insulating film
4 channel layer
5 source-drain electrode
6 passivation film
7 connection hole
8 interconnect
10 support substrate
11 data line control circuit
12 gate line control circuit
13 gate line
14 data line
15 pixel electrode
16 thin film switching transistor
17 buffer capacitor 18 current driving thin film transistor
19 organic EL diode
20 support substrate
21 source-drain electrode
22 channel layer
23 gate insulating film
24 gate electrode
25 passivation film
30 support substrate
31 counter electrode
32 organic EL layer
33 intermediate layer
34 interlayer insulating film (planarizing film)
35 interlayer insulating film also serving as support substrate
40 support substrate
41 gate electrode
42 gate insulating film
43 channel layer
44 source electrode
45 drain electrode
46 insulating film (passivation film)
47 interlayer insulating film (planarizing film)
48 write once electrode
50 high frequency power source or receiving antenna
51 antenna terminal
52 thin film transistor
53 ground
54 output terminal (load circuit connection terminal)
55 high frequency input waveform
56 rectification output waveform
60 interlayer insulating film
70 input terminal
71 reference voltage terminal
72 oxide semiconductor diode for temperature measurement
73 temperature calibrating reference voltage
74 ground
75 output terminal
76 n-type oxide semiconductor
77 p-type oxide semiconductor

The invention claimed is:

1. An oxide semiconductor device comprising a gate electrode formed over a main surface of a substrate, a gate insulating film formed to a layer over the gate electrode, a channel layer formed to a layer over the gate insulating film and a source electrode and a drain electrode formed with a predetermined distance therebetween to a layer over the channel layer, in which
the channel layer includes an oxide semiconductor composed mainly of zinc oxide and tin oxide,
the channel layer contains a contaminant that is a group III element, having an impurity concentration (B),
the channel layer contains a counter dopant, having an impurity concentration (A), that is group IV element, a group V element, or both of the group IV element and the group V element, and
a ratio between the impurity concentration (A) of the counter dopant that is the group IV element, the group V element, or both of the group IV element and the group V element and the impurity concentration (B) of the contaminant group III element is: A/B≤1.0.

2. The oxide semiconductor device according to claim 1, wherein
the ratio between the impurity concentration (A) of the group IV element, the group V element, or both of the group IV element and the group V element, and the impurity concentration (B) of the group III element is: A/B≤0.3.

3. The oxide semiconductor device according to claim 1, wherein
the impurity concentration of the group III element is 9.0 at. % or less.

4. The oxide semiconductor device according to claim 1, wherein
the group III element includes one of B, Al, Ga, and In, or a combination of two or more of B, Al, Ga, and In.

5. The oxide semiconductor device according to claim 1, wherein
the group IV element includes one of C, Si, and Ge, or a combination of two or more of C, Si, and Ge.

6. The oxide semiconductor device according to claim 1, wherein
the group V element includes one of N, P, and As, or a combination of two or more of N, P, and As.

7. The oxide semiconductor device according to claim 1, wherein
the ingredient compositional ratio (Zn/(Zn+Sn)) of zinc (Zn) and tin (Sn) contained in the channel layer is 0.6 to 0.8.

8. The oxide semiconductor device according to claim 1, wherein
the ingredient compositional ratio (Zn/(Zn+Sn)) of zinc (Zn) and tin (Sn) contained in the channel layer is 0.65 to 0.7.

9. The oxide semiconductor device according to claim 1, wherein
the resistivity of the channel layer is $1\times10^{-1}$ Ωcm or more.

10. The oxide semiconductor device according to claim 1, wherein
the gate electrode, the source electrode, and the drain electrode each include a transparent electroconductive film.

11. An oxide semiconductor device comprising a source electrode and a drain electrode formed with a predetermined distance therebetween over the main surface of a substrate, a channel layer formed over the substrate between the source electrode and the drain electrode with the both ends riding over the source electrode and the drain electrode respectively, a gate insulating film formed over the channel layer, and a gate electrode formed to a layer over the gate insulating film, in which
the channel layer includes an oxide semiconductor composed mainly of zinc oxide and tin oxide,
the channel layer contains a contaminant that is a group III element, having an impurity concentration (B),
the channel layer contains a counter dopant, having an impurity concentration (A), that is a group IV element, a group V element, or both of the group IV element and the group V element, and
a ratio between the impurity concentration (A) of the counter dopant that is the group IV element, the group V element or both of the group IV element and the group V element, and the impurity concentration (B) of the contaminant group III element is A/B:≤1.0.

12. The oxide semiconductor device according to claim 11, wherein
the ratio of the impurity concentration (A) of the group IV element, the group V element, or both of the group IV element and the group V element, and the impurity concentration (B) of the group III element is: A/B≤0.3.

13. The oxide semiconductor device according to claim 11, wherein
the impurity concentration of the group III element is 9.0 at. % or less.

14. The oxide semiconductor device according to claim 11, wherein the group III element includes one of B, Al, Ga, and In or a combination of two or more of B, Al, Ga, and In.

15. The oxide semiconductor device according to claim 11, wherein
the group IV element includes one of C, Si, and Ge or a combination of two or more of C, Si, and Ge.

16. The oxide semiconductor device according to claim 11, wherein
the group V element includes one of N, P, and As, or a combination of two or more of N, P, and As.

17. The oxide semiconductor device according to claim 11, wherein
the ingredient compositional ratio (Zn/(Zn+Sn)) of zinc (Zn) and tin (Sn) contained in the channel layer is 0.6 to 0.8.

18. The oxide semiconductor device according to claim 11, wherein
the ingredient compositional ratio (Zn/(Zn+Sn)) of zinc (Zn) and tin (Sn) contained in the channel layer is 0.65 to 0.7.

19. The oxide semiconductor device according to claim 11, wherein
the resistivity of the channel layer is $1 \times 10^{-1}$ Ωcm or more.

20. The oxide semiconductor device according to claim 11, wherein
the gate electrode, the source electrode, and the drain electrode each include a transparent electroconductive film.

21. An oxide semiconductor device comprising a gate electrode formed over a main surface of a substrate, a gate insulating film formed to a layer over the gate electrode, a channel layer formed to a layer over the gate insulating film and a source electrode and a drain electrode formed with a predetermined distance therebetween to a layer over the channel layer, in which
the channel layer consists of zinc oxide, tin oxide, a contaminant that is a group III element, having an impurity concentration (B), and a counter dopant, having an impurity concentration (A), that is a group IV element, a group V element, or both of the group IV element and the group V element, and
a ratio between the impurity concentration (A) of the counter dopant that is the group IV element, the group V element, or both of the group IV element and the group V element and the impurity concentration (B) of the contaminant group III element is: A/B≤1.0.

* * * * *